(12) United States Patent
Karda et al.

(10) Patent No.: US 12,080,331 B2
(45) Date of Patent: Sep. 3, 2024

(54) MEMORY DEVICE HAVING 2-TRANSISTOR VERTICAL MEMORY CELL AND SHIELD STRUCTURES

(71) Applicant: Micron Technology, Inc., Boise, ID (US)

(72) Inventors: Kamal M. Karda, Boise, ID (US); Haitao Liu, Boise, ID (US); Karthik Sarpatwari, Boise, ID (US); Durai Vishak Nirmal Ramaswamy, Boise, ID (US); Alessandro Calderoni, Boise, ID (US); Richard E Fackenthal, Carmichael, CA (US); Duane R. Mills, Shingle Springs, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 18/200,871

(22) Filed: May 23, 2023

(65) Prior Publication Data

US 2023/0298652 A1  Sep. 21, 2023

Related U.S. Application Data

(62) Division of application No. 17/186,962, filed on Feb. 26, 2021, now Pat. No. 11,688,450.

(51) Int. Cl.
  *G11C 11/404* (2006.01)
(52) U.S. Cl.
  CPC ................. *G11C 11/404* (2013.01)
(58) Field of Classification Search
  CPC ....................................................... H10B 41/70
  See application file for complete search history.

(56) References Cited

U.S. PATENT DOCUMENTS 10,153,381 B1 * 12/2018 Bhattacharyya .... H01L 29/7926
10,763,273 B2 *  9/2020 Wu ........................ H10B 43/27
(Continued)

FOREIGN PATENT DOCUMENTS

KR      20190080688 A    7/2019
WO   WO-2022182838 A1    9/2022

OTHER PUBLICATIONS

U.S. Appl. No. 17/186,962 U.S. Pat. No. 11,688,450, filed Feb. 26, 2021, Memory Device Having 2-Transistor Veritcal Memory Cell and Shield Structures.

(Continued)

*Primary Examiner* — Douglas King
(74) *Attorney, Agent, or Firm* — Schwegman Lundberg & Woessner, P.A.

(57) ABSTRACT

Some embodiments include apparatuses in which one of such apparatus includes a first memory cell including a first transistor having a first channel region coupled between a data line and a conductive region, and a first charge storage structure located between the first data line and the conductive region, and a second transistor having a second channel region coupled to and located between the first data line and the first charge storage structure; a second memory cell including a third transistor having a third channel region coupled between a second data line and the conductive region, and a second charge storage structure located between the second data line and the conductive region, and a fourth transistor having a fourth channel region coupled to and located between the second data line and the second charge storage structure; a conductive line forming a gate of each of the first, second, third, and fourth transistors; and a conductive structure located between the first and second charge storage structures and electrically separated from the conductive region.

10 Claims, 24 Drawing Sheets

(56) References Cited

U.S. PATENT DOCUMENTS

| | | | |
|---|---|---|---|
| 10,978,485 B2* | 4/2021 | Lue | H10B 51/20 |
| 11,145,763 B2* | 10/2021 | Pillarisetty | H01L 29/66666 |
| 11,688,450 B2 | 6/2023 | Karda et al. | |
| 2011/0303974 A1 | 12/2011 | Kim et al. | |
| 2016/0118128 A1 | 4/2016 | Hsiung et al. | |
| 2018/0122943 A1 | 5/2018 | Han et al. | |
| 2018/0182762 A1 | 6/2018 | Juengling | |
| 2020/0211615 A1 | 7/2020 | Sarpatwari et al. | |
| 2022/0278112 A1 | 9/2022 | Karda et al. | |

OTHER PUBLICATIONS

"International Application Serial No. PCT/US2022/017653, International Search Report mailed Jun. 13, 2022", 3 pgs.

"International Application Serial No. PCT/US2022/017653, Written Opinion mailed Jun. 13, 2022", 4 pgs.

"International Application Serial No. PCT US2022 017653, International Preliminary Report on Patentability mailed Sep. 7, 2023", 6 pages.

* cited by examiner

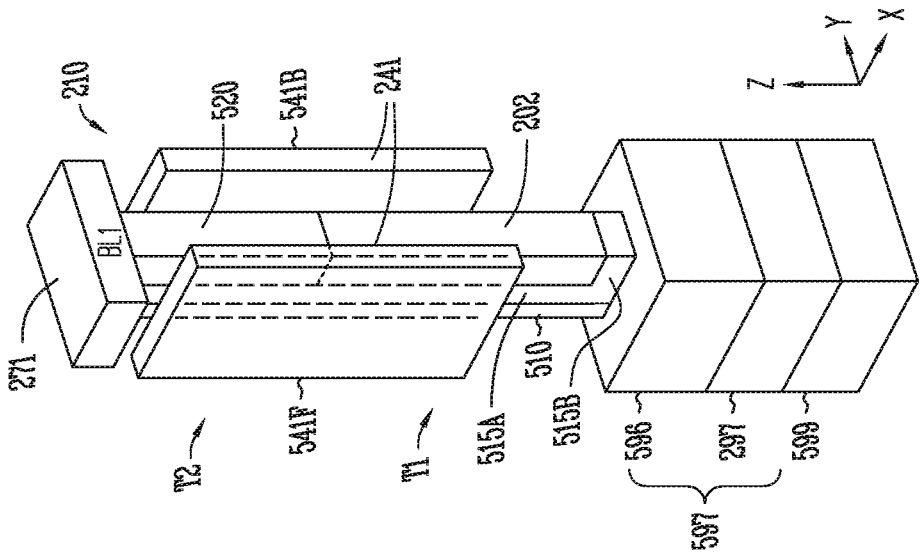
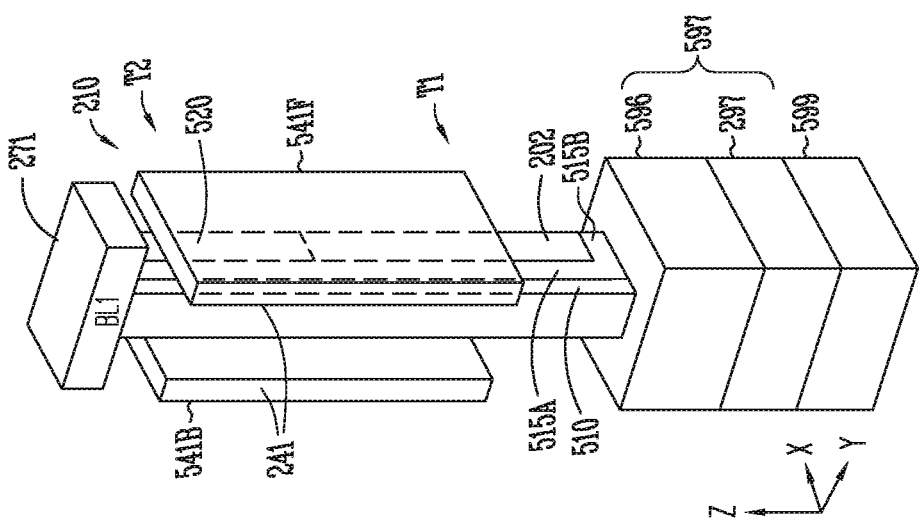
FIG. 5A
FIG. 5B

MEMORY DEVICE HAVING 2-TRANSISTOR VERTICAL MEMORY CELL AND SHIELD STRUCTURES

PRIORITY APPLICATION

This application is a divisional of U.S. application Ser. No. 17/186,962, filed Feb. 26, 2021, which is incorporated herein by reference in its entirety.

BACKGROUND

Memory devices are widely used in computers and many other electronic items to store information. Memory devices are generally categorized into two types: volatile memory device and non-volatile memory device. A memory device usually has numerous memory cells in which to store information. In a volatile memory device, information stored in the memory cells is lost if supply power is disconnected from the memory device. In a non-volatile memory device, information stored in the memory cells is retained even if supply power is disconnected from the memory device.

The description herein involves volatile memory devices. Most conventional volatile memory devices store information in the form of charge in a capacitor structure included in the memory cell. As demand for device storage density increases, many conventional techniques provide ways to shrink the size of the memory cell in order to increase device storage density for a given device area. However, physical limitations and fabrication constraints may pose a challenge to such conventional techniques if the memory cell size is to be shrunk to a certain dimension. Further, increased device storage density for a given area may cause excessive capacitive coupling between elements of adjacent memory cells. Unlike some conventional memory devices, the memory devices described herein include features that can overcome challenges faced by conventional techniques.

BRIEF DESCRIPTION OF THE DRAWINGS

FIG. 5A through FIG. 7D show different views of a structure of the memory device of FIG. 2 including conductive structures extending in the Y-direction, according to some embodiments described herein.

DETAILED DESCRIPTION

The memory device described herein includes volatile memory cells in which each of the memory cells can include two transistors (2T). One of the two transistors has a charge storage structure, which can form a memory element of the memory cell to store information. The memory device described herein can have a structure (e.g., a 4F2 cell footprint) that allows the size of the memory device to be relatively smaller than the size of similar conventional memory devices. The described memory device can include a single access line (e.g., word line) to control two transistors of a memory cell. This can lead to reduced power dissipation and improved processing. The described memory device can include shield structures between charge storage structures of adjacent memory cells. The shield structures can boost the capacitance of charge storage structures and reduce capacitive coupling between adjacent charge storage structures of adjacent memory cells. In including the described shield structures in the described memory device can improve operations (e.g., improve read signal margin) of the memory device. Each of the memory cells of the described memory device can include a cross-point gain cell structure (and cross-point operation), such that a memory cell can be accessed using a single access line (e.g., word line) and single data line (e.g., bit line) during an operation (e.g., a read or write operation) of the memory device. Other improvements and benefits of the described memory device and its variations are discussed below with reference to FIG. 1 through FIG. 12C.

Figure 1:
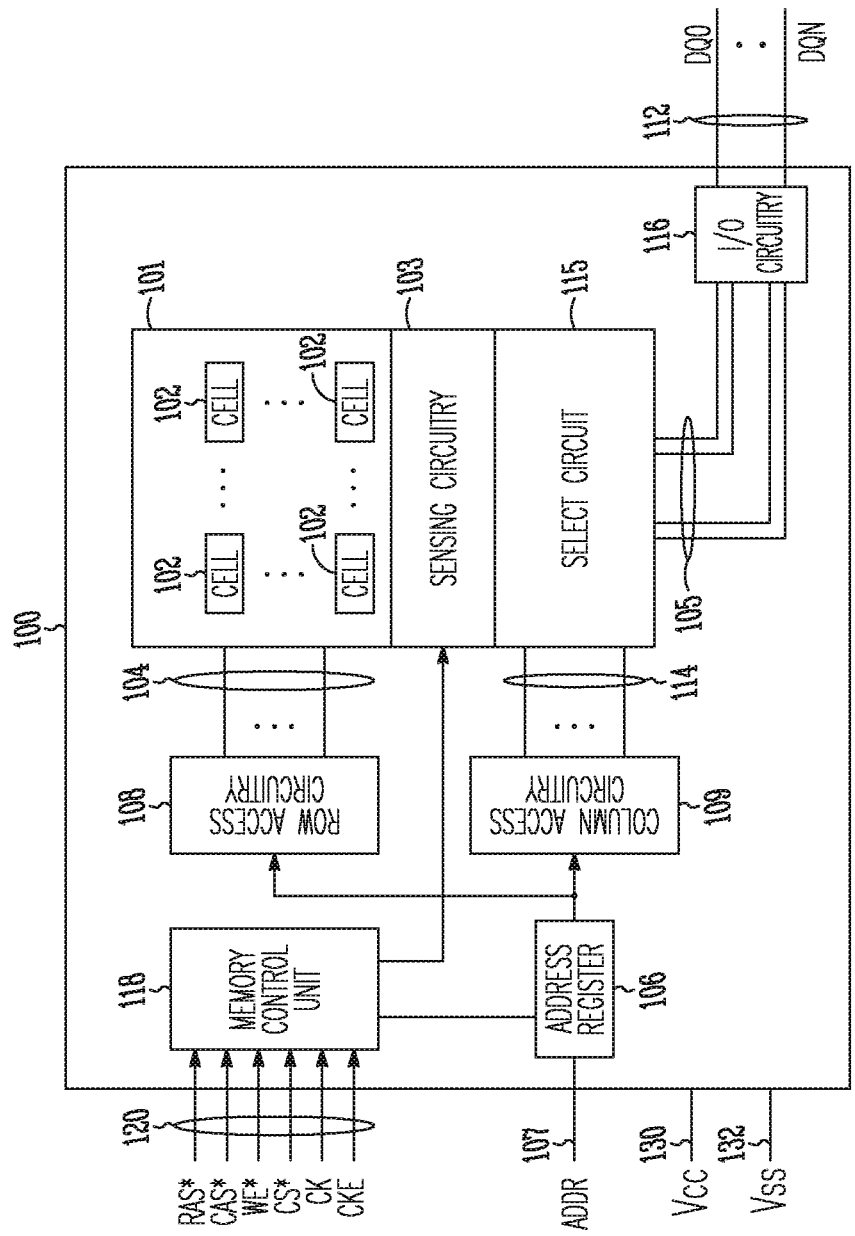
FIG. 1 shows a block diagram of an apparatus in the form of a memory device including memory cells, according to some embodiments described herein.

FIG. 1 shows a block diagram of an apparatus in the form of a memory device 100 including volatile memory cells, according to some embodiments described herein. Memory device 100 includes a memory array 101, which can contain memory cells 102. Memory device 100 can include a volatile memory device such that memory cells 102 can be volatile memory cells. An example of memory device 100 includes a dynamic random-access memory (DRAM) device. Information stored in memory cells 102 of memory device 100 may be lost (e.g., invalid) if supply power (e.g., supply voltage Vcc) is disconnected from memory device 100. Hereinafter, supply voltage Vcc is referred to as representing some voltage levels; however, they are not limited to a supply voltage (e.g., Vcc) of the memory device (e.g., memory device 100). For example, if the memory device (e.g., memory device 100) has an internal voltage generator (not shown in FIG. 1) that generates an internal voltage based on supply voltage Vcc, such an internal voltage may be used instead of supply voltage Vcc.

In a physical structure of memory device 100, each of memory cells 102 can include transistors (e.g., two transistors) formed vertically (e.g., stacked on different layers) in different levels over a substrate (e.g., semiconductor substrate) of memory device 100. Memory device 100 can also include multiple levels (e.g., multiple decks) of memory cells where one level (e.g., one deck) of memory cells can be formed over (e.g., stacked on) another level (e.g., another deck) of additional memory cells. The structure of memory array 101, including memory cells 102, can include the structure of memory arrays and memory cells described below with reference to FIG. 2 through FIG. 12C.

As shown in FIG. 1, memory device 100 can include access lines 104 (e.g., "word lines") and data lines (e.g., bit lines) 105. Memory device 100 can use signals (e.g., word line signals) on access lines 104 to access memory cells 102 and data lines 105 to provide information (e.g., data) to be stored in (e.g., written) or read (e.g., sensed) from memory cells 102.

Memory device 100 can include an address register 106 to receive address information ADDR (e.g., row address signals and column address signals) on lines 107 (e.g., address lines). Memory device 100 can include row access circuitry 108 (e.g., X-decoder) and column access circuitry 109 (e.g., Y-decoder) that can operate to decode address information ADDR from address register 106. Based on decoded address information, memory device 100 can determine which memory cells 102 are to be accessed during a memory operation. Memory device 100 can perform a write operation to store information in memory cells 102, and a read operation to read (e.g., sense) information (e.g., previously stored information) in memory cells 102. Memory device 100 can also perform an operation (e.g., a refresh operation) to refresh (e.g., to keep valid) the value of information stored in memory cells 102. Each of memory cells 102 can be configured to store information that can represent at most one bit (e.g., a single bit having a binary 0 ("0") or a binary 1 ("1")), or more than one bit (e.g., multiple bits having a combination of at least two binary bits).

Memory device 100 can receive a supply voltage, including supply voltages Vcc and Vss, on lines 130 and 132, respectively. Supply voltage Vss can operate at a ground potential (e.g., having a value of approximately zero volts). Supply voltage Vcc can include an external voltage supplied to memory device 100 from an external power source such as a battery or an alternating current to direct current (AC-DC) converter circuitry.

As shown in FIG. 1, memory device 100 can include a memory control unit 118, which includes circuitry (e.g., hardware components) to control memory operations (e.g., read and write operations) of memory device 100 based on control signals on lines (e.g., control lines) 120. Examples of signals on lines 120 include a row access strobe signal RAS*, a column access strobe signal CAS*, a write-enable signal WE*, a chip select signal CS*, a clock signal CK, and a clock-enable signal CKE. These signals can be part of signals provided to a DRAM device.

As shown in FIG. 1, memory device 100 can include lines (e.g., global data lines) 112 that can carry signals DQ0 through DQN. In a read operation, the value (e.g., "0" or "1") of information (read from memory cells 102) provided to lines 112 (in the form of signals DQ0 through DQN) can be based on the values of the signals on data lines 105. In a write operation, the value (e.g., "0" or "1") of information provided to data lines 105 (to be stored in memory cells 102) can be based on the values of signals DQ0 through DQN on lines 112.

Memory device 100 can include sensing circuitry 103, select circuitry 115, and input/output (I/O) circuitry 116. Column access circuitry 109 can selectively activate signals on lines (e.g., select lines) based on address signals ADDR. Select circuitry 115 can respond to the signals on lines 114 to select signals on data lines 105. The signals on data lines 105 can represent the values of information to be stored in memory cells 102 (e.g., during a write operation) or the values of information read (e.g., sensed) from memory cells 102 (e.g., during a read operation).

I/O circuitry 116 can operate to provide information read from memory cells 102 to lines 112 (e.g., during a read operation) and to provide information from lines 112 (e.g., provided by an external device) to data lines 105 to be stored in memory cells 102 (e.g., during a write operation). Lines 112 can include nodes within memory device 100 or pins (or solder balls) on a package where memory device 100 can reside. Other devices external to memory device 100 (e.g., a hardware memory controller or a hardware processor) can communicate with memory device 100 through lines 107, 112, and 120.

Memory device 100 may include other components, which are not shown in FIG. 1 so as not to obscure the example embodiments described herein. At least a portion of memory device 100 (e.g., a portion of memory array 101) can include structures and operations similar to or identical to any of the memory devices described below with reference to FIG. 2 through FIG. 12C.

Figure 2:
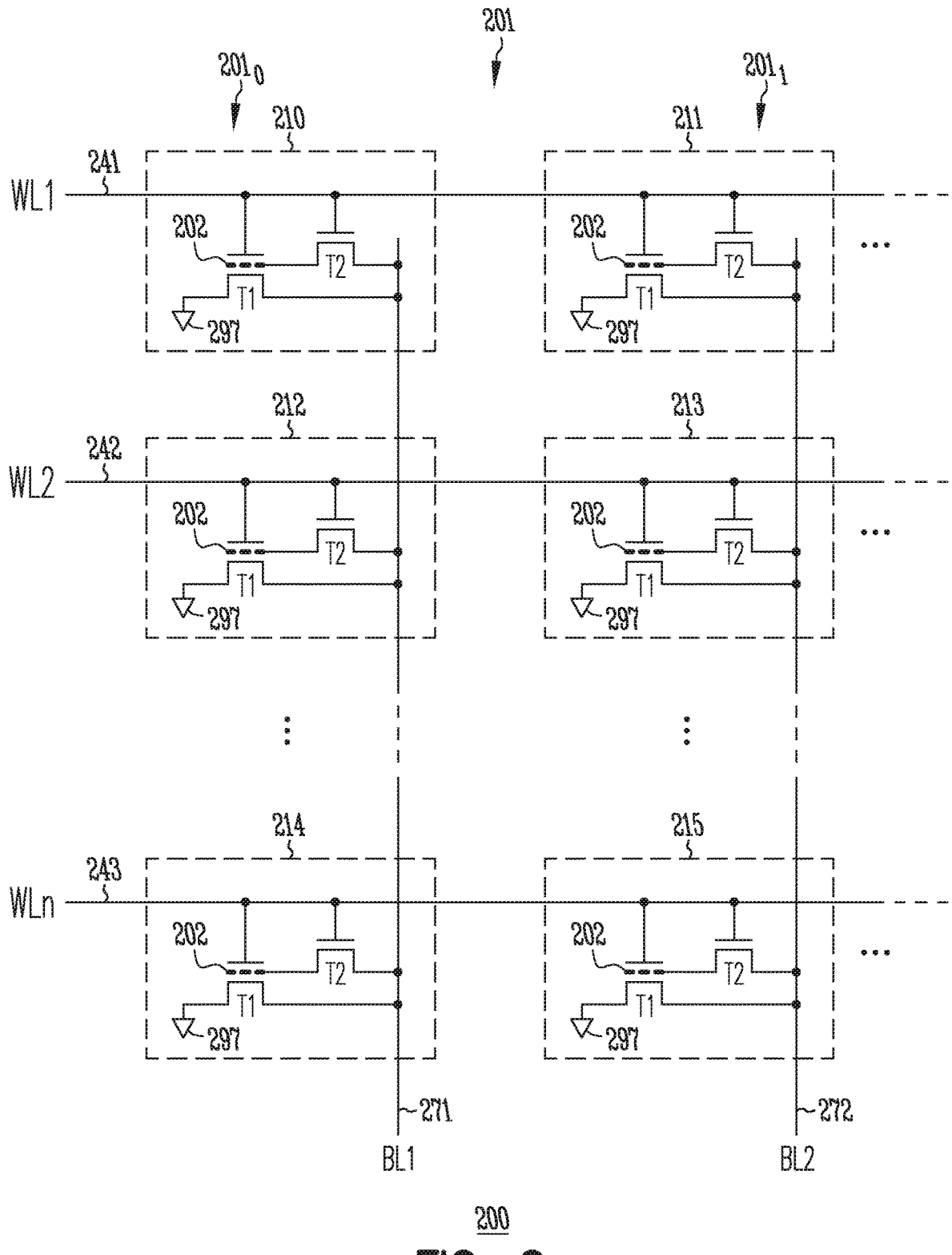
FIG. 2 shows a schematic diagram of a portion of a memory device including a memory array of two-transistor (2T) memory cells, according to some embodiments described herein.

FIG. 2 shows a schematic diagram of a portion of a memory device 200 including a memory array 201, according to some embodiments described herein. Memory device 200 can correspond to memory device 100 of FIG. 1. For example, memory array 201 can form part of memory array 101 of FIG. 1. As shown in FIG. 2, memory device 200 can include memory cells 210 through 215, which are volatile memory cells (e.g., DRAM cells). For simplicity, similar or identical elements among memory cells 210 through 215 are given the same labels.

Each of memory cells 210 through 215 can include two transistors T1 and T2. Thus, each of memory cells 210 through 215 can be called a 2T memory cell (e.g., 2T gain cell). Each of transistors T1 and T2 can include a field-effect transistor (FET). As an example, transistor T1 can be a p-channel FET (PFET), and transistor T2 can be an n-channel FET (NFET). Part of transistor T1 can include a structure of a p-channel metal-oxide semiconductor (PMOS) transistor FET (PFET). Thus, transistor T1 can include an operation similar to that of a PMOS transistor. Part of transistor T2 can include an n-channel metal-oxide semiconductor (NMOS). Thus, transistor T2 can include an operation similar to that of a NMOS transistor.

Transistor T1 of memory device 200 can include a charge-storage based structure (e.g., a floating-gate based). As shown in FIG. 2, each of memory cells 210 through 215 can include a charge storage structure 202, which can include the floating gate of transistor T1. Charge storage structure 202 can form the memory element of a respective memory cell among memory cells 210 through 215. Charge storage structure 202 can store charge. The value (e.g., "0" or "1") of information stored in a particular memory cell among memory cells 210 through 215 can be based on the amount of charge in charge storage structure 202 of that particular memory cell. For example, the value of information stored in a particular memory cell among memory cells 210 through 215 can be "0" or "1" (if each memory cell is configured as a single-bit memory cell) or "00", "01", "10", "11" (or other multi-bit values) if each memory cell is configured as a multi-bit memory cell.

As shown in FIG. 2, transistor T2 (e.g., the channel region of transistor T2) of a particular memory cell among memory cells 210 through 215 can be electrically coupled to (e.g., directly coupled to) charge storage structure 202 of that particular memory cell. Thus, a circuit path (e.g., current path) can be formed directly between transistor T2 of a particular memory cell and charge storage structure 202 of that particular memory cell during an operation (e.g., a write operation) of memory device 200. During a write operation of memory device 200, a circuit path (e.g., current path) can be formed between a respective data line (e.g., data line 271 or 272) and charge storage structure 202 of a particular memory cell through transistor T2 (e.g., through the channel region of transistor T2) of the particular memory cell.

Memory cells 210 through 215 can be arranged in memory cell groups $201_0$ and $201_1$. FIG. 2 shows two memory cell groups (e.g., $201_0$ and $201_1$) as an example. However, memory device 200 can include more than two memory cell groups. Memory cell groups $201_0$ and $201_1$ can include the same number of memory cells. For example, memory cell group $201_0$ can include memory cells 210, 212, and 214, and memory cell group $201_1$ can include memory cells 211, 213, and 215. FIG. 2 shows three memory cells in each of memory cell groups $201_0$ and $201_1$ as an example. The number of memory cells in memory cell groups $201_0$ and $201_1$ can be different from three.

Memory device 200 can perform a write operation to store information in memory cells 210 through 215, and a read operation to read (e.g., sense) information from memory cells 210 through 215. Memory device 200 can be configured to operate as a DRAM device. However, unlike some conventional DRAM devices that store information in a structure such as a container for a capacitor, memory device 200 can store information in the form of charge in charge storage structure 202 (which can be a floating gate structure). As mentioned above, charge storage structure 202 can be the floating gate of transistor T1. During an operation (e.g., a read or write operation) of memory device 200, an access line (e.g., a single access line) and a data line (e.g., a single data line) can be used to access a selected memory cell (e.g., target memory cell).

As shown in FIG. 2, memory device 200 can include access lines (e.g., word lines) 241, 242, and 243 that can carry respective signals (e.g., word line signals) WL1, WL2, and WLn. Access lines 241, 242, and 243 can be used to access both memory cell groups $201_0$ and $201_1$. Each of access lines 241, 242, and 243 can be structured as at least one conductive line (one conductive line or multiple conductive lines where the multiple conductive lines can be electrically coupled (e.g., shorted) to each other).

Access lines 241, 242, and 243 can be selectively activated (e.g., activated one at a time) during an operation (e.g., read or write operation) of memory device 200 to access a selected memory cell (or selected memory cells) among memory cells 210 through 215. A selected cell can be referred to as a target cell. In a read operation, information can be read from a selected memory cell (or selected memory cells). In a write operation, information can be stored in a selected memory cell (or selected memory cells).

In memory device 200, a single access line (e.g., a single word line) can be used to control (e.g., turn on or turn off) transistors T1 and T2 of a respective memory cell during either a read or write operation of memory device 200. Some conventional memory devices may use multiple (e.g., two separate) access lines to control access to a respective memory cell during read and write operations. In comparison with such conventional memory devices (that use multiple access lines for the same memory cell), memory device 200 uses a single access line (e.g., shared access line) in memory device 200 to control both transistors T1 and T2 of a respective memory cell to access the respective memory cell. This technique can save space and simplify operation of memory device 200. Further, some conventional memory devices may use multiple data lines to access a selected memory cell (e.g., during a read operation) to read information from the selected memory cell. In memory device 200, a single data line (e.g., data line 271 or 272) can be used to access a selected memory cell (e.g., during a read operation) to read information from the selected memory cell. This may also simplify the structure, operation, or both of memory device 200 in comparison with conventional memory devices that use multiple data lines to access a selected memory cell.

In memory device 200, the gate of each of transistors T1 and T2 can be part of a respective access line (e.g., a respective word line). As shown in FIG. 2, the gate of each of transistors T1 and T2 of memory cell 210 can be part of access line 241. The gate of each of transistors T1 and T2 of memory cell 211 can be part of access line 241. For example, in the structure of memory device 200, four different portions of a conductive material (or materials) that forms access line 241 can form the gates (e.g., four gates) of transistors T1 and T2 of memory cell 210 and the gates of transistors T1 and T2 of memory cell 211, respectively.

The gate of each of transistors T1 and T2 of memory cell 212 can be part of access line 242. The gate of each of transistors T1 and T2 of memory cells 213 can be part of access line 242. For example, in the structure of memory device 200, four different portions of a conductive material (or materials) that form access line 242 can form the gates (e.g., four gates) of transistors T1 and T2 of memory cell 212 and the gates of transistors T1 and T2 of memory cell 213, respectively.

The gate of each of transistors T1 and T2 of memory cell 214 can be part of access line 243. The gate of each of transistors T1 and T2 of memory cell 215 can be part of access line 243. For example, in the structure of memory device 200, four different portions of a conductive material (or materials) that form access line 243 can form the gates (e.g., four gates) of transistors T1 and T2 of memory cell 214 and the gates of transistors T1 and T2 of memory cell 215, respectively.

Memory device 200 can include data lines (e.g., bit lines) 271 and 272 that can carry respective signals (e.g., bit line signals) BL1 and BL2. During a read operation, memory device 200 can use data line 271 to obtain information read (e.g., sensed) from a selected memory cell of memory cell group $201_0$, and data line 272 to read information from a selected memory cell of memory cell group $201_1$. During a write operation, memory device 200 can use data line 271 to provide information to be stored in a selected memory cell of memory cell group $201_0$, and data line 272 to provide information to be stored in a selected memory cell of memory cell group $201_1$.

Memory device 200 can include a ground connection (e.g., ground plate) 297 coupled to each of memory cells 210 through 215. Ground connection 297 can be structured from a conductive plate (e.g., a layer of conductive material) that can be coupled to a ground terminal of memory device 200.

As an example, ground connection 297 can be part of a common conductive structure (e.g., a common conductive plate) that can be formed on a level of memory device 200 that is under the memory cells (e.g., memory cells 210 through 215) of memory device 200. In this example, the elements (e.g., part of transistors T1 and T2 or the entire transistors T1 and T2) of each of the memory cells (e.g., memory cells 210 through 215) of memory device 200 can be formed (e.g., formed vertically) over the common conductive structure (e.g., a common conductive plate) and electrically coupled to the common conductive structure.

In another example, ground connection 297 can be part of separate conductive structures that can be formed on a level of memory device 200 that is under the memory cells (e.g., memory cells 210 through 215) of memory device 200. In this example, the elements (e.g., part of transistors T1 and T2) of each of the memory cells (e.g., memory cells 210 through 215) of memory device 200 can be formed over (e.g., formed vertically) respective conductive structures among the separate conductive structures and electrically coupled to the respective conductive structures.

As shown in FIG. 2, transistor T1 (e.g., the channel region of transistor T1) of a particular memory cell among memory cells 210 through 215 can be electrically coupled to (e.g., directly coupled to) ground connection 297 and electrically coupled to (e.g., directly coupled to) a respective data line (e.g., data line 271 or 272). Thus, a circuit path (e.g., current path) can be formed between a respective data line (e.g., data line 271 or 272) and ground connection 297 through transistor T1 of a selected memory cell during an operation (e.g., a read operation) performed on the selected memory cell.

Memory device 200 can include read paths (e.g., circuit paths). Information read from a selected memory cell during a read operation can be obtained through a read path coupled to the selected memory cell. In memory cell group $201_0$, a read path of a particular memory cell (e.g., memory cell 210, 212, or 214) can include a current path (e.g., read current path) through a channel region of transistor T1 of that particular memory cell, data line 271, and ground connection 297. In memory cell group $201_1$, a read path of a particular memory cell (e.g., memory cell 211, 213, or 215) can include a current path (e.g., read current path) through a channel region of transistor T1 of that particular memory cell, data line 272, and ground connection 297. In the example where transistor T1 is a PFET (e.g., a PMOS), the current in the read path (e.g., during a read operation) can include a hole conduction (e.g., hole conduction in the direction from data line 271 to ground connection 297 through the channel region of transistor T1). Since transistor T1 can be used in a read path to read information from the respective memory cell during a read operation, transistor T1 can be called a read transistor and the channel region of transistor T1 can be called a read channel region.

Memory device 200 can include write paths (e.g., circuit paths). Information to be stored in a selected memory cell during a write operation can be provided to the selected memory cell through a write path coupled to the selected memory cell. In memory cell group $201_0$, a write path of a particular memory cell can include transistor T2 (e.g., can include a write current path through a channel region of transistor T2) of that particular memory cell and data line 271. In memory cell group $201_1$, a write path of a particular memory cell (e.g., memory cell 211, 213, or 215) can include transistor T2 (e.g., can include a write current path through a channel region of transistor T2) of that particular memory cell and data line 272. In the example where transistor T2 is an NFET (e.g., NMOS), the current in a write path (e.g., during a write operation) can include an electron conduction (e.g., electron conduction in the direction from data line 271 to charge storage structure 202) through the channel region of transistor T2. Since transistor T2 can be used in a write path to store information in a respective memory cell during a write operation, transistor T2 can be called a write transistor and the channel region of transistor T2 can be called a write channel region.

Each of transistors T1 and T2 can have a threshold voltage (Vt). Transistor T1 has a threshold voltage Vt1. Transistor T2 has a threshold voltage Vt2. The values of threshold voltages Vt1 and Vt2 can be different (unequal values). For example, the value of threshold voltage Vt2 can be greater than the value of threshold voltage Vt1. The difference in values of threshold voltages Vt1 and Vt2 allows reading (e.g., sensing) of information stored in charge storage structure 202 in transistor T1 on the read path during a read operation without affecting (e.g., without turning on) transistor T2 on the write path (e.g., path through transistor T2). This can prevent leaking of charge (e.g., during a read operation) from charge storage structure 202 through transistor T2 of the write path.

In a structure of memory device 200, transistors T1 and T2 can be formed (e.g., engineered) such that threshold voltage Vt1 of transistor T1 can be less than zero volts (e.g., Vt1<0V) regardless of the value (e.g., "0" or "F") of information stored in charge storage structure 202 of transistor T1, and Vt1<Vt2. Charge storage structure 202 can be in state "0" when information having a value of "0" is stored in charge storage structure 202. Charge storage structure 202 can be in state "F" when information having a value of "F" is stored in charge storage structure 202. Thus, in this structure, the relationship between the values of threshold voltages Vt1 and Vt2 can be expressed as follows: Vt1 for state "0"<Vt1 for state "F"<0V, and Vt2=0V (or alternatively Vt2>0V).

In an alternative structure of memory device 200, transistors T1 and T2 can be formed (e.g., engineered) such that Vt1 for state "0"<Vt1 for state "1", where Vt1 for state "0"<0V (or alternatively Vt1 for state "0"=0V), Vt1 for state "1">0V, and Vt1<Vt2.

In another alternative structure, transistors T1 and T2 can be formed (e.g., engineered) such that Vt1 (for state "0") <Vt1 (for state "1"), where Vt1 for state "0"=0V (or alternatively Vt1 for state "0">0V), and Vt1<Vt2.

During a read operation of memory device 200, only one memory cell of the same memory cell group can be selected one at a time to read information from the selected memory cell. For example, memory cells 210, 212, and 214 of memory cell group $201_0$ can be selected one at a time during a read operation to read information from the selected memory cell (e.g., one of memory cells 210, 212, and 214 in this example). In another example, memory cells 211, 213, and 215 of memory cell group $201_1$ can be selected one at a time during a read operation to read information from the selected memory cell (e.g., one of memory cells 211, 213, and 215 in this example).

During a read operation, memory cells of different memory cell groups (e.g., memory cell groups $201_0$ and $201_1$) that share the same access line (e.g., access line 241, 242, or 243) can be concurrently selected (or alternatively can be sequentially selected). For example, memory cells 210 and 211 can be concurrently selected during a read operation to read (e.g., concurrently read) information from memory cells 210 and 211. Memory cells 212 and 213 can be concurrently selected during a read operation to read (e.g., concurrently read) information from memory cells 212 and 213. Memory cells 214 and 215 can be concurrently selected during a read operation to read (e.g., concurrently read) information from memory cells 214 and 215.

The value of information read from the selected memory cell of memory cell group $201_0$ during a read operation can be determined based on the value of a current detected (e.g., sensed) from a read path (described above) that includes data line 271, transistor T1 of the selected memory cell (e.g., memory cell 210, 212, or 214), and ground connection 297. The value of information read from the selected memory cell of memory cell group $201_1$ during a read operation can be determined based on the value of a current detected (e.g., sensed) from a read path that includes data line 272, transistor T1 of the selected memory cell (e.g., memory cell 211, 213, or 215), and ground connection 297.

Memory device 200 can include detection circuitry (not shown) that can operate during a read operation to detect (e.g., sense) a current (e.g., current I1, not shown) on a read path that includes data line 271, and detect a current (e.g., current I2, not shown) on a read path that includes data line 272. The value of the detected current can be based on the value of information stored in the selected memory cell. For example, depending on the value of information stored in the selected memory cell of memory cell group $201_0$, the value of the detected current (e.g., the value of current I1) on data line 271 can be zero or greater than zero. Similarly, depending on the value of information stored in the selected memory cell of memory cell group $201_1$, the value of the detected current (e.g., the value of current I2) between data line 272 can be zero or greater than zero. Memory device 200 can include circuitry (not shown) to translate the value of a detected current into the value (e.g., "0", "1", or a combination of multi-bit values) of information stored in the selected memory cell.

During a write operation of memory device 200, only one memory cell of the same memory cell group can be selected at a time to store information in the selected memory cell. For example, memory cells 210, 212, and 214 of memory cell group $201_0$ can be selected one at a time during a write operation to store information in the selected memory cell (e.g., one of memory cell 210, 212, and 214 in this example). In another example, memory cells 211, 213, and 215 of memory cell group $201_1$ can be selected one at a time during a write operation to store information in the selected memory cell (e.g., one of memory cell 211, 213, and 215 in this example).

During a write operation, memory cells of different memory cell groups (e.g., memory cell groups $201_0$ and $201_1$) that share the same access line (e.g., access line 241, 242, or 243) can be concurrently selected. For example, memory cells 210 and 211 can be concurrently selected during a write operation to store (e.g., concurrently store) information in memory cells 210 and 211. Memory cells 212 and 213 can be concurrently selected during a write operation to store (e.g., concurrently store) information in memory cells 212 and 213. Memory cells 214 and 215 can be concurrently selected during a write operation to store (e.g., concurrently store) information in memory cells 214 and 215.

Information to be stored in a selected memory cell of memory cell group $201_0$ during a write operation can be provided through a write path (described above) that includes data line 271 and transistor T2 of the selected memory cell (e.g., memory cell 210, 212, or 214). Information to be stored in a selected memory cell of memory cell group $201_1$ during a write operation can be provided through a write path (described above) that includes data line 272 and transistor T2 of the selected memory cell (e.g., memory cell 211, 213, or 215). As described above, the value (e.g., binary value) of information stored in a particular memory cell among memory cells 210 through 215 can be based on the amount of charge in charge storage structure 202 of that particular memory cell.

In a write operation, the amount of charge in charge storage structure 202 of a selected memory cell can be changed (to reflect the value of information stored in the selected memory cell) by applying a voltage on a write path that includes transistor T2 of that particular memory cell and the data line (e.g., data line 271 or 272) coupled to that particular memory cell. For example, a voltage having one value (e.g., 0V) can be applied on data line 271 (e.g., provide 0V to signal BL1) if information to be stored in a selected memory cell among memory cells 210, 212, and 214 has one value (e.g., "0"). In another example, a voltage having another value (e.g., a positive voltage) can be applied on data line 271 (e.g., provide a positive voltage to signal BL1) if information to be stored in a selected memory cell among memory cells 210, 212, and 214 has another value (e.g., "1"). Thus, information can be stored (e.g., directly stored) in charge storage structure 202 of a particular memory cell by providing the information to be stored (e.g., in the form of a voltage) on a write path (that includes transistor T2) of that particular memory cell.

Figure 3:
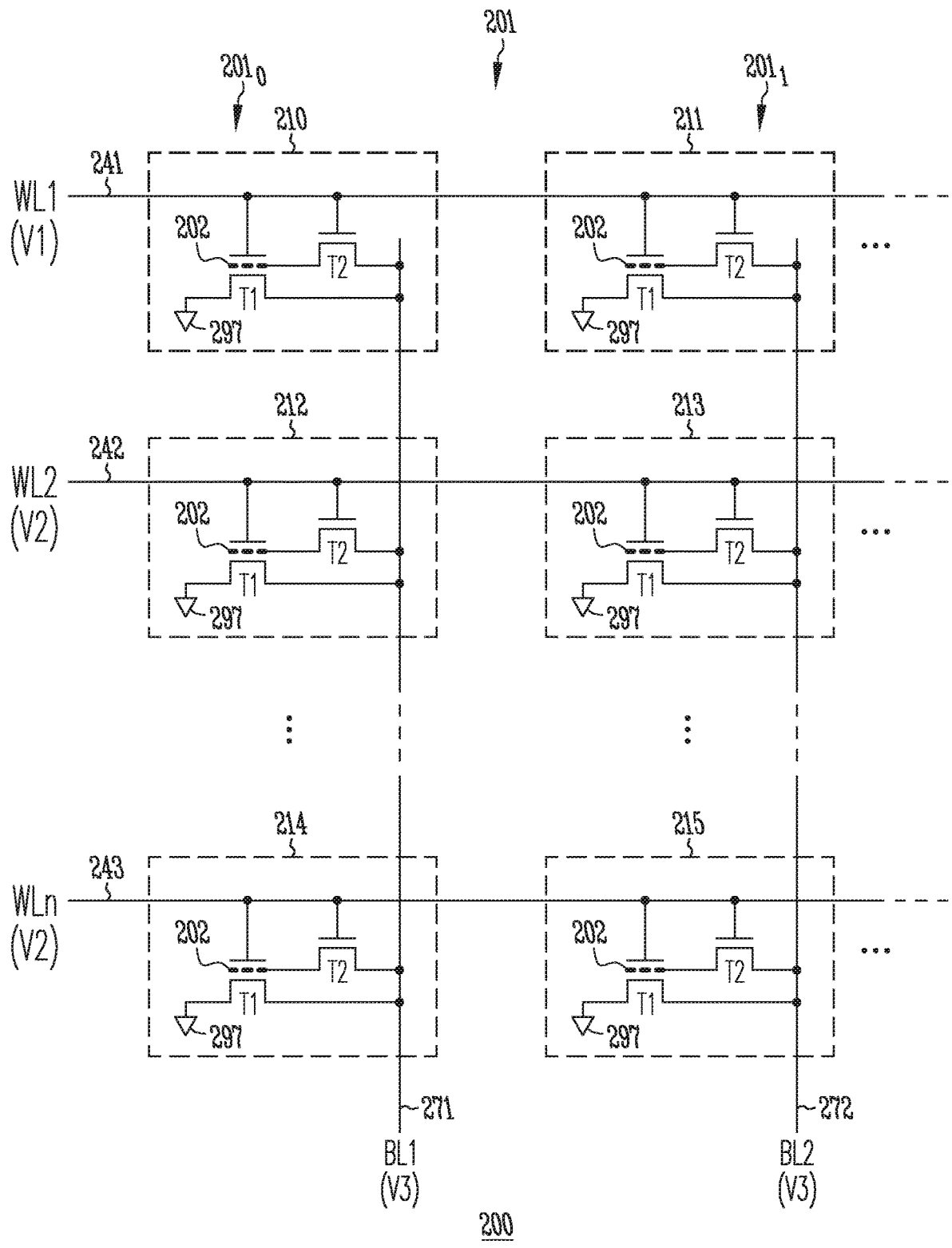
FIG. 3 shows the memory device of FIG. 2, including example voltages used during a read operation of the memory device, according to some embodiments described herein.

FIG. 3 shows memory device 200 of FIG. 2 including example voltages V1, V2, and V3 used during a read operation of memory device 200, according to some embodiments described herein. The example of FIG. 3 assumes that memory cells 210 and 211 are selected memory cells (e.g., target memory cells) during a read operation to read (e.g., to sense) information stored (e.g., previously stored) in memory cells 210 and 211. Memory cells 212 through 215 are assumed to be unselected memory cells. This means that memory cells 212 through 215 are not accessed, and information stored in memory cells 212 through 215 is not read while information is read from memory cells 210 and 211 in the example of FIG. 3.

In FIG. 3, voltages V1, V2, and V3 can represent different voltages applied to respective access lines 241, 242, and 243 and data lines 271 and 272 during a read operation of memory device 200. As an example, voltages V1, V2, and V3 can have values −1V, 0V, and 0.5V, respectively. The specific values of voltages used in this description are only example values. Different values may be used. For example, voltage V1 can have a negative value range (e.g., the value of voltage V1 can be from −3V to −1V).

In the read operation shown in FIG. 3, voltage V1 can have a value (voltage value) to turn on transistor T1 of each of memory cells 210 and 211 (selected memory cells in this example) and turn off (or keep off) transistor T2 of each of memory cells 210 and 211. This allows information to be read from memory cells 210 and 211. Voltage V2 can have a value, such that transistors T1 and T2 of each of memory cells 212 through 215 (unselected memory cells in this example) are turned off (e.g., kept off). Voltage V3 can have a value, such that a current (e.g., read current) may be formed on a read path that includes data line 271 and transistor T1 of memory cell 210, and a read path (a separate read path) that includes data line 272 and transistor T1 of memory cell 212. This allows a detection of current on the read paths coupled to memory cells 210 and 211, respectively. A detection circuitry (not shown) of memory device 200 can operate to translate the value of the detected current (during reading of information from the selected memory cells) into the value (e.g., "0", "1", or a combination of multi-bit values) of information read from the selected memory cell. In the example of FIG. 3, the value of the detected currents on data lines 271 and 272 can be translated into the values of information read from memory cells 210 and 211, respectively.

In the read operation shown in FIG. 3, the voltages applied to respective access lines 241, 242, and 243 can cause transistors T1 and T2 of each of memory cells 212 through 215, except transistor T1 of each of memory cells 210 and 211 (selected memory cells), to turn off (or to remain turned off). Transistor T1 of memory cell 210 (selected memory cell) may or may not turn on, depending on the value of the threshold voltage Vt1 of transistor T1 of memory cell 210. Transistor T1 of memory cell 211 (selected memory cell) may or may not turn on, depending on the value of the threshold voltage Vt1 of transistor T1 of memory cell 211. For example, if transistor T1 of each of memory cells (e.g., 210 through 215) of memory device 200 is configured (e.g., structured) such that the threshold voltage of transistor T1 is less than zero (e.g., Vt1<−1V) regardless of the value (e.g., the state) of information stored in a respective memory cell 210, then transistor T1 of memory cell 210, in this example, can turn on and conduct a current on data line 271 (through transistor T1 of memory cell 210). In this example, transistor T1 of memory cell 211 can also turn on and conduct a current on data line 272 (through transistor T1 of memory cell 211). Memory device 200 can determine the value of information stored in memory cells 210 and 211 based on the value of the currents on data lines 271 and 272, respectively. As described above, memory device 200 can include detection circuitry to measure the value of currents on data lines 271 and 272 during a read operation.

Figure 4:
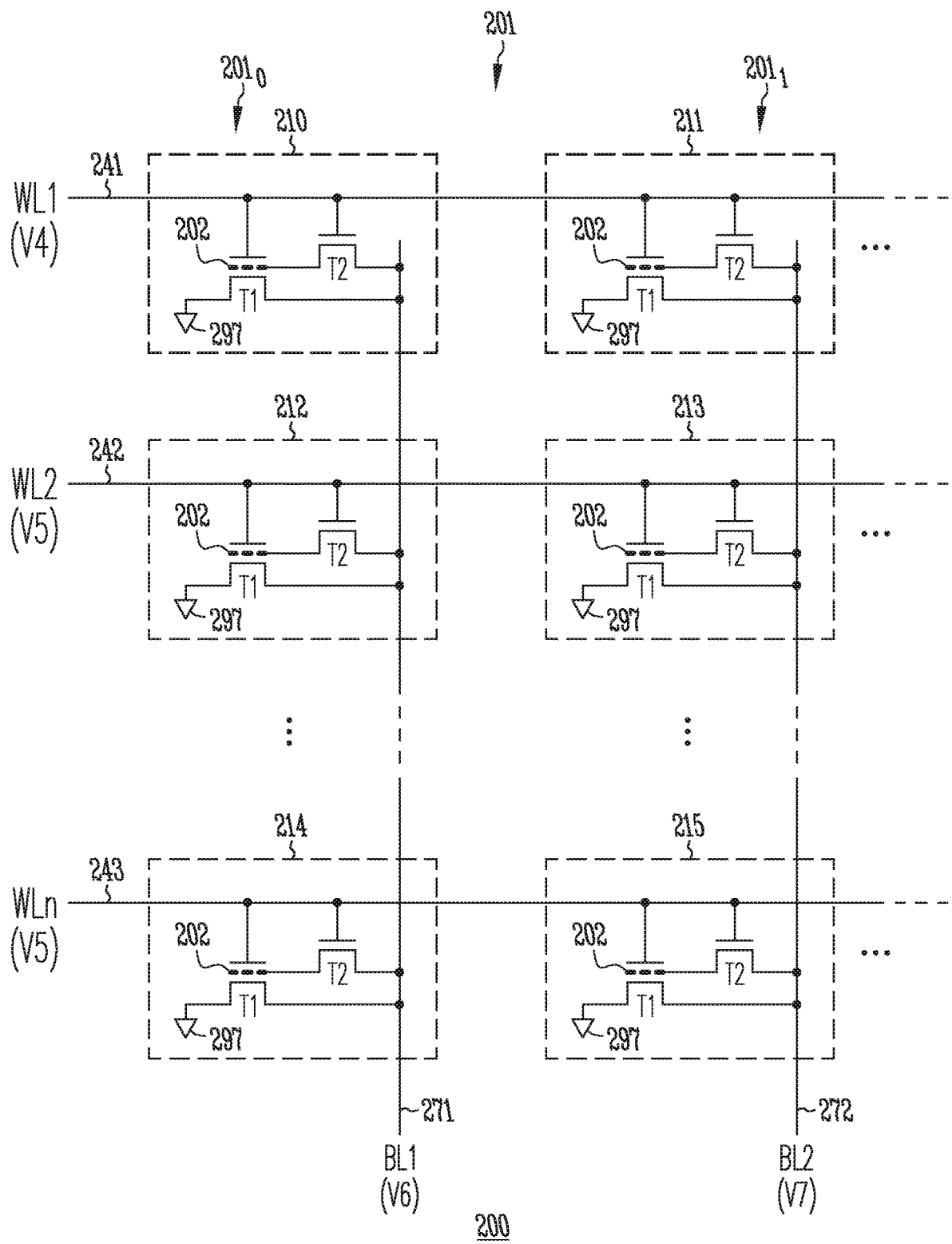
FIG. 4 shows the memory device of FIG. 2, including example voltages used during a write operation of the memory device, according to some embodiments described herein.

FIG. 4 shows memory device 200 of FIG. 2 including example voltages V4, V5, V6, and V7 used during a write operation of memory device 200, according to some embodiments described herein. The example of FIG. 4 assumes that memory cells 210 and 211 are selected memory cells (e.g., target memory cells) during a write operation to store information in memory cells 210 and 211. Memory cells 212 through 215 are assumed to be unselected memory cells. This means that memory cells 212 through 215 are not accessed and information is not to be stored in memory cells 212 through 215 while information is stored in memory cells 210 and 211 in the example of FIG. 4.

In FIG. 4, voltages V4, V5, V6, and V7 can represent different voltages applied to respective access lines 241, 242, and 243 and data lines 271 and 272 during a write operation of memory device 200. As an example, voltages V4 and V5 can have values of 3V and 0V, respectively. These values are example values. Different values may be used.

The values of voltages V6 and V7 can be the same or different depending on the value (e.g., "0" or "F") of information to be stored in memory cells 210 and 211. For example, the values of voltages V6 and V7 can be the same (e.g., V6=V7) if the memory cells 210 and 211 are to store information having the same value. As an example, V6=V7=0V if information to be stored in each memory cell 210 and 211 is "0", and V6=V7=1V to 3V if information to be stored in each memory cell 210 and 211 is "1".

In another example, the values of voltages V6 and V7 can be different (e.g., V6≠V7) if the memory cells 210 and 211 are to store information having different values. As an example, V6=0V and V7=1V to 3V if "0" is to be stored in memory cell 210 and "1" is to be stored in memory cell 211. As another example, V6=1V to 3V and V7=0V if "1" is to be stored in memory cell 210 and "0" is to be stored in memory cell 211.

The range of voltage of 1V to 3V is used here as an example. A different range of voltages can be used. Further, instead of applying 0V (e.g., V6=0V or V7=0V) to a particular write data line (e.g., data line 271 or 272) for storing information having a value of "0" to the memory cell (e.g., memory cell 210 or 211) coupled to that particular write data line, a positive voltage (e.g., V6>0V or V7>0V) may be applied to that particular data line.

In a write operation of memory device 200 of FIG. 4, voltage V5 can have a value, such that transistors T1 and T2 of each of memory cells 212 through 215 (unselected memory cells, in this example) are turned off (e.g., kept off). Voltage V4 can have a value to turn on transistor T2 of each of memory cells 210 and 211 (selected memory cells in this example) and form a write path between charge storage structure 202 of memory cell 210 and data line 271, and a write path between charge storage structure 202 of memory cell 211 and data line 272. A current (e.g., write current) may be formed between charge storage structure 202 of memory cell 210 (selected memory cell) and data line 271. This current can affect (e.g., change) the amount of charge on charge storage structure 202 of memory cell 210 to reflect the value of information to be stored in memory cell 210. A current (e.g., another write current) may be formed between charge storage structure 202 of memory cell 211 (selected memory cell) and data line 272. This current can affect (e.g., change) the amount of charge on charge storage structure 202 of memory cell 211 to reflect the value of information to be stored in memory cell 211.

In the example write operation of FIG. 4, the value of voltage V6 may cause charge storage structure 202 of memory cell 210 to discharge or to be charged, such that the resulting charge (e.g., charge remaining after the discharge or charge action) on charge storage structure 202 of memory cell 210 can reflect the value of information stored in memory cell 210. Similarly, the value of voltage V7 in this example may cause charge storage structure 202 of memory cell 211 to discharge or to be charged, such that the resulting charge (e.g., charge remaining after the discharge or charge action) on charge storage structure 202 of memory cell 211 can reflect the value of information stored in memory cell 211.

FIG. 5A through FIG. 7D show different views of a structure of memory device 200 of FIG. 2 with respect to the X, Y, and Z directions, according to some embodiments described herein. For simplicity, cross-sectional lines (e.g., hatch lines) are omitted from most of the elements shown in FIG. 5A through FIG. 7D and other figures (e.g., FIG. 8A through FIG. 12C) in the drawings described herein. Some elements of memory device 200 (and other memory devices described herein) may be omitted from a particular figure of the drawings so as to not obscure the description of the element (or elements) being described in that particular figure. The dimensions (e.g., physical structures) of the elements shown in the drawings described herein are not scaled.

Figure 6A:
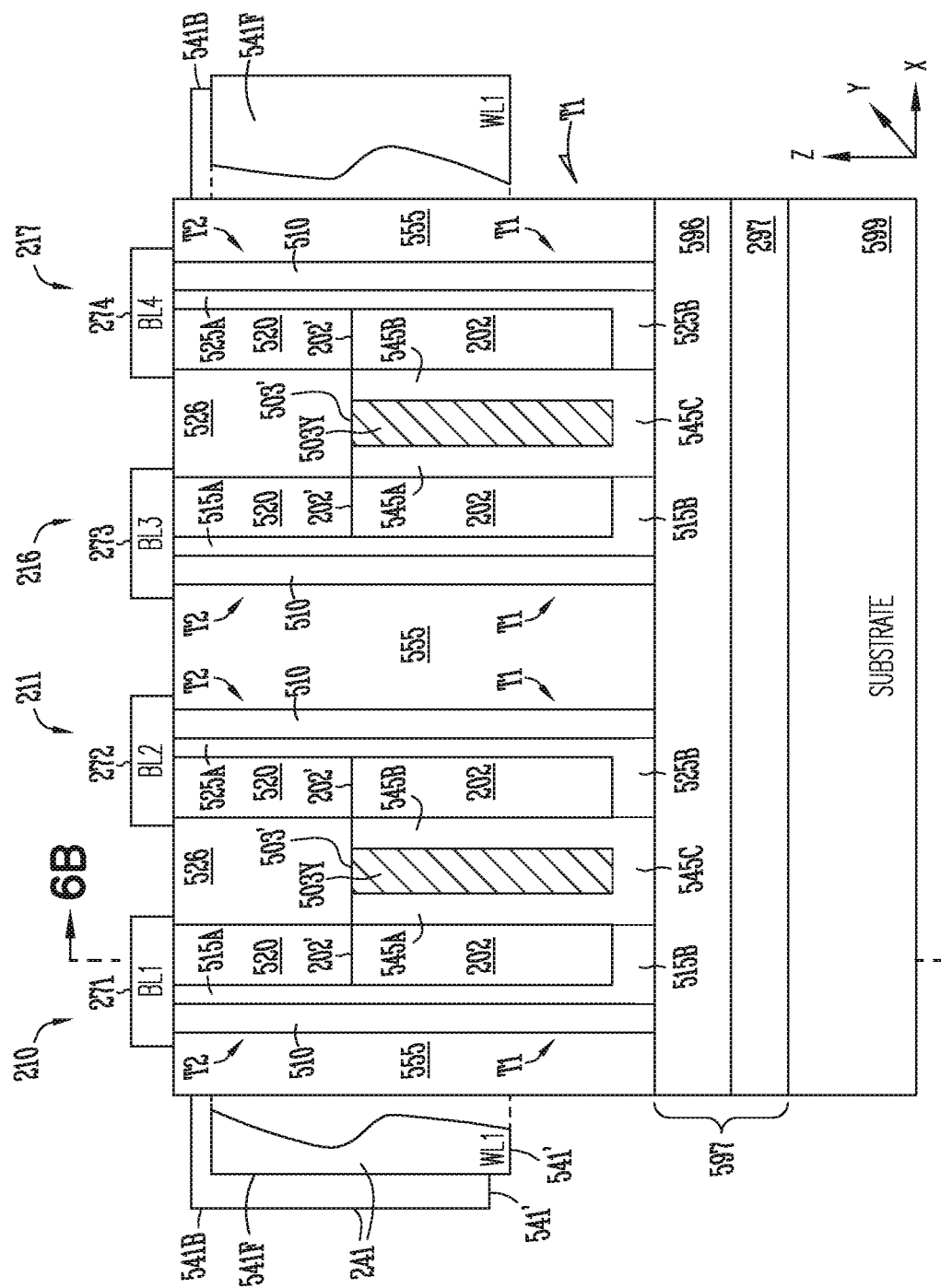
Figure 6B:
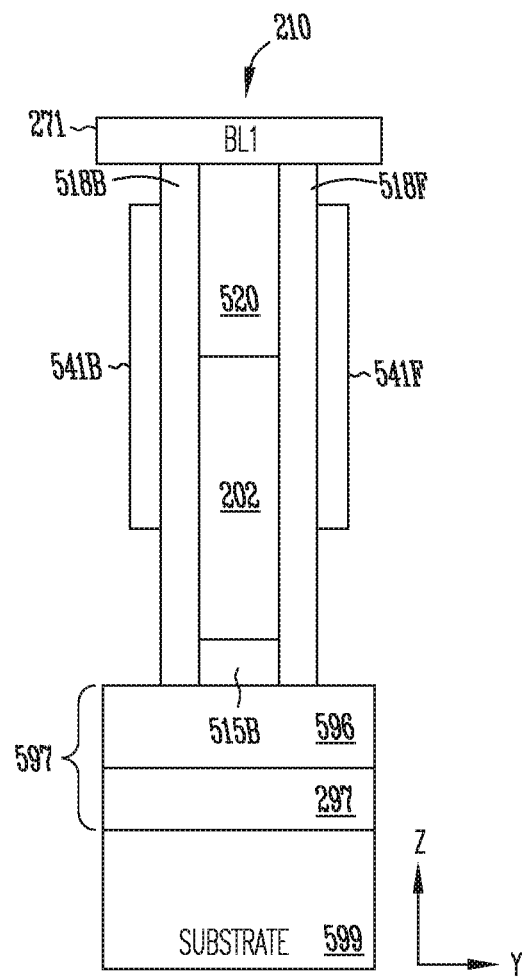
Figure 7A:
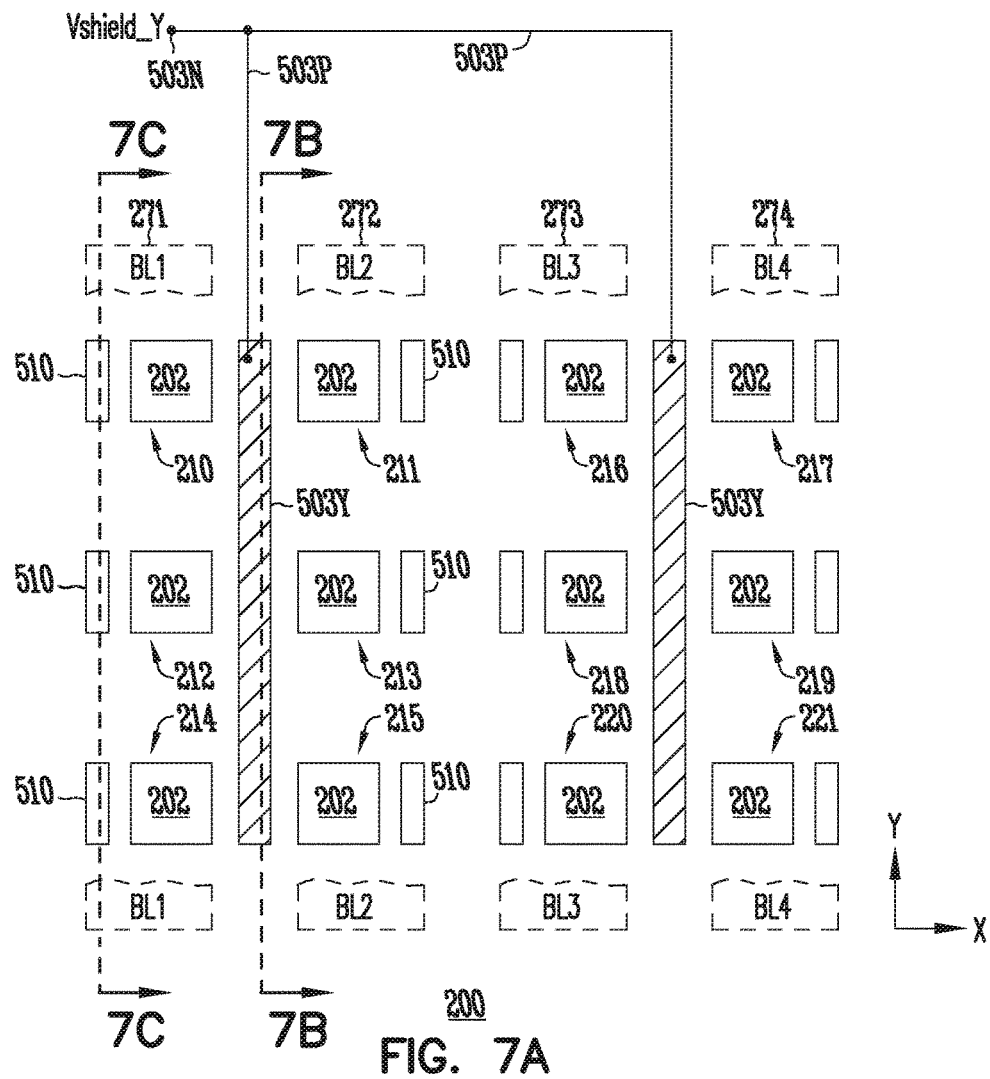
Figure 7D:
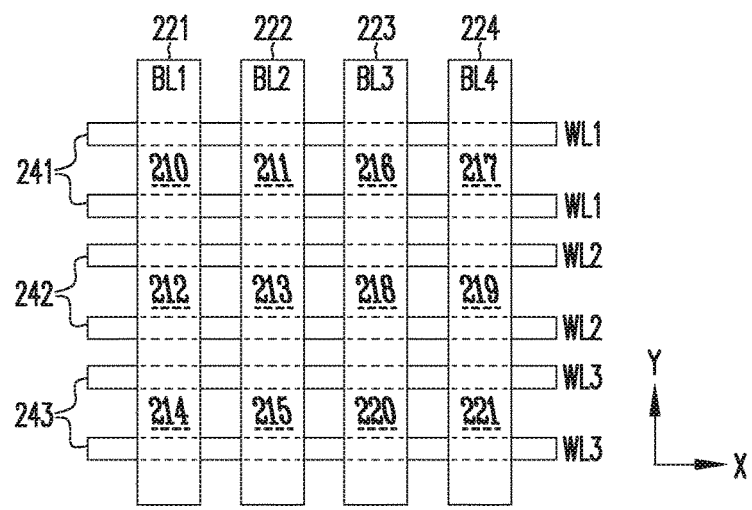
Figure 7B:
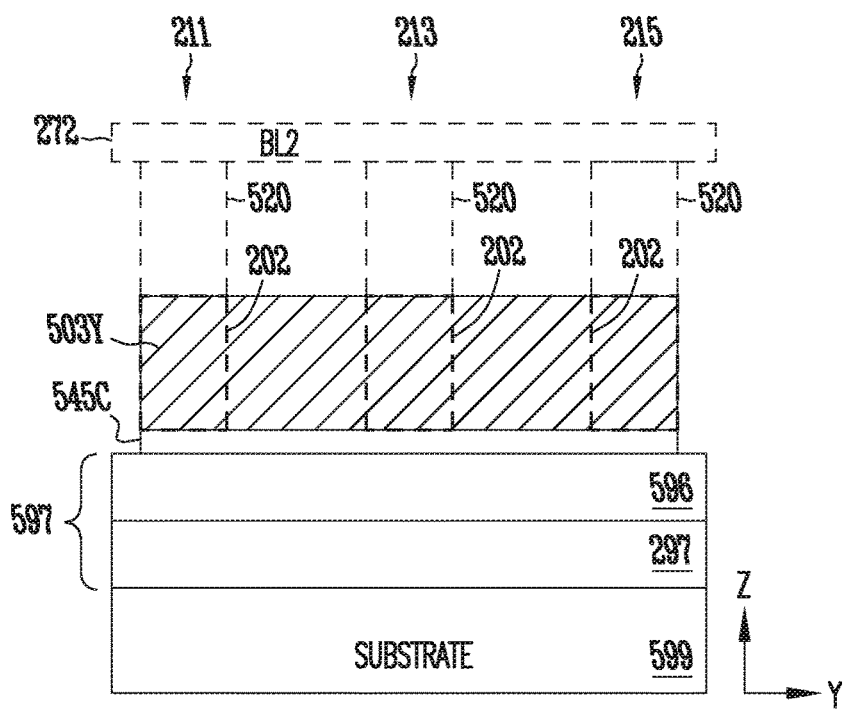
Figure 7C:
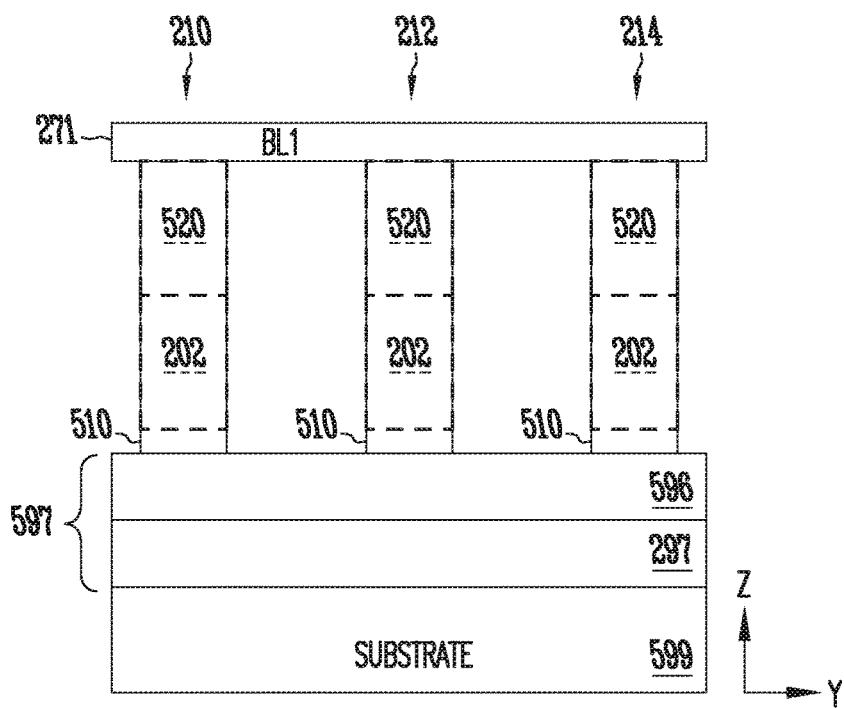

FIG. 5A and FIG. 5B show different 3-dimensional views (e.g., isometric views) of memory device 200 including memory cell 210 with respect to the X, Y, and Z directions. FIG. 6A shows a side view (e.g., cross-sectional view) of memory device 200 including memory cells 210, 211, 212, and 213 with respect to the X-Z direction. FIG. 6B shows a view (e.g., cross-sectional view) taken along line 6B-6B of FIG. 6A. FIG. 7A shows a top view (e.g., plan view) of a portion of memory device 200 of FIG. 6A. It is noted that memory cells 216, 217, 218, 219, 220, and 221 and data lines 273 and 274 (and associated signals BL3 and BL4) in FIG. 7A are not shown in FIG. 2 through FIG. 6B. FIG. 7D shows a top view of FIG. 7A including relative locations of data lines 271, 272, 273, and 274 (and associated signals BL1, BL2, BL3, and BL4), and access lines 241, 242, and 243 (associated signals WL1, WL2, WL3, and WL4). For simplicity, other elements of memory device 200 are omitted from FIG. 7D. FIG. 7B and FIG. 7C show different views (e.g., cross-sectional views) taken along lines 7B-7B and 7C-7C, respectively, of FIG. 7A.

The following description refers to FIG. 5A through FIG. 7D. FIG. 5A and FIG. 5B show the structure of one memory cell (e.g., memory cell 210) of memory device 200. The structures of other memory cells (e.g., memory cells 211 through 221 in FIG. 7A) of memory device 200 can be similar to or identical to the structure of memory cell 210. In FIG. 2 and FIG. 5A through FIG. 7D, the same elements are given the same reference numbers. Some portions (e.g., gate oxide and cell isolation structures) of memory device 200 are omitted from FIG. 5A through FIG. 7D so as to not obscure structure the elements of memory device 200 in the embodiments described herein.

As shown in FIG. 5A, memory device 200 can include a substrate 599 over which memory cell 210 (and other memory cells (not shown) of memory device 200) can be formed. Transistors T1 and T2 of memory cell 210 can be formed vertically with respect to substrate 599. Substrate 599 can be a semiconductor substrate (e.g., silicon-based substrate) or other type of substrate. The Z-direction (e.g., vertical direction) is a direction perpendicular to (e.g., outward from) substrate 599. The Z-direction is also perpendicular to (e.g., extended vertically from) the X-direction and the Y-direction. The X-direction and Y-direction are perpendicular to each other.

As shown in FIG. 5A and FIG. 5B, ground connection 297 can include a structure (e.g., a piece (e.g., a layer)) of conductive material (e.g., conductive region) located over (formed over) substrate 599. Example materials for ground connection 297 include a piece of metal, conductively doped polysilicon, or other conductive materials. Ground connection 297 can be coupled to a ground terminal (not shown) of memory device 200. FIG. 5A and FIG. 5B show ground connection 297 contacting (e.g., directly coupled to) substrate 599 as an example. In an alternative structure, memory device 200 can include a dielectric (e.g., a layer of dielectric material, not shown) between ground connection 297 and substrate 599.

As shown in FIG. 5A through FIG. 7D, memory device 200 can include a semiconductor material 596 formed over ground connection 297. Semiconductor material 596 can include a structure (e.g., a piece (e.g., a layer)) of silicon, polysilicon, or other semiconductor material, and can include a doped region (e.g., p-type doped region), or other conductive materials.

As shown in FIG. 5A and FIG. 7D, each of data lines 271, 272, 273, and 274 (associated with signals BL1, BL2, BL3, and BL4, respectively) can have a length in the Y-direction, a width in the X-direction, and a thickness in the Z-direction. Each of data lines 271, 272, 273, and 274 can include a conductive material (or a combination of materials) that can be structured as a conductive line (e.g., conductive region). Example materials for data lines 271, 272, 273, and 274 include metal, conductively doped polysilicon, or other conductive materials.

As shown in FIG. 5A, FIG. 5B, and FIG. 6A, access line 241 can be structured by (can include) a combination of portions 541F and 541B (e.g., front and back conductive portions) that can be opposite from each other in respect to the Y-direction. Each of portions 541F and 541B can include a conductive material (or a combination of materials) that can be structured as a conductive line (e.g., conductive region) having a length extending continuously in the X-direction. Thus, portions 541F and 541B can be part of conductive lines that are opposite from each other (e.g., opposite from each other in the Y-direction).

Each of portions 541F and 541B can include structure (e.g., a piece (e.g., a layer)) of conductive material (e.g., metal, conductively doped polysilicon, or other conductive materials). Each of portions 541F and 541B can have a length (shown in FIG. 5A) in the X-direction, a width (shown in FIG. 5A) in the Z-direction, and a thickness (shown in FIG. 8A) in the Y-direction.

Portions 541F and 541B can be electrically coupled to each other. For example, memory device 200 can include a conductive material (e.g., not shown) that can contact (e.g., electrically couple to) portions 541F and 541B, such that portions 541F and 541B (which are part of a single access line 241) can be concurrently applied by the same signal (e.g., signal WL1).

In an alternative structure of memory device 200, one of the two portions (e.g., portions 541F and 541B) of each of the access lines of memory device 200 can be omitted. For example, either portion 541F or portion 541B be omitted, such that access line 241 can include only either portion 541F or portion 541B. In the structure shown in FIG. 5A through FIG. 7D, including two portions (e.g., portions 541F and 541B, and portions 542F and 542B) in each access line can help better control transistor T1 (e.g., transistor T1, shown schematically in FIG. 2) of each of the memory cells of memory device 200 during a read operation.

Charge storage structure 202 (FIG. 5A through FIG. 7C) of each memory cell of memory device 200 can include a charge storage material (or a combination of materials), which can include a piece (e.g., a layer) of semiconductor material (e.g., polysilicon), a piece (e.g., a layer) of metal, or a piece of material (or materials) that can trap charge. The materials for charge storage structure 202 and the portions (e.g., portions 541F and 541B in FIG. 5A) of the access lines (e.g., access line 241) of memory device 200 an be the same or can be different. As shown in FIG. 5A, charge storage structure 202 can include a portion (e.g., bottom portion) that is closer (e.g., extends in the Z-direction closer) to substrate 599 than the bottom portion of each of portions 541F and 541B of access line 241.

As shown in FIG. 6A, each charge storage structure 202 can include an edge (e.g., top edge) 202', and portions 541F and 541B of access line 241 can include respective edges (e.g., bottom edges) 541'. FIG. 6A shows an example where edge 202' is at a specific distance (e.g., distance shown in FIG. 6A) from edges 541'. However, the distance between edge 202' of charge storage structure 202 and edges 541' of portions 541F and 541B may vary. For example, FIG. 6A shows edges 541' being below edge 202' with respect to the Z-direction, such that portions 541F and 541B can overlap (in the Z-direction) charge storage structure 202. However, edges 541' can alternatively be above edge 202' with respect to the Z-direction, such that portions 541F and 541B may not overlap (in the Z-direction) charge storage structure 202.

As shown in FIG. 5A, FIG. 5B, and FIG. 6A, memory device 200 can include material 520 located between data line 271 and charge storage structure 202. Material 520 can be electrically coupled to data line 271 and charge storage structure 202 of memory cell 210. As described above, charge storage structure 202 of memory cell 210 can form the memory element of memory cell 210. Thus, memory cell 210 can include a memory element (which is charge storage structure 202) located between substrate 599 and material 520 with respect to the Z-direction, and the memory element contacts (e.g., directly coupled to) material 520.

Material 520 can form a source (e.g., source terminal), a drain (e.g., drain terminal), a channel region (e.g., write channel region) between the source and the drain of transistor T2 of memory cell 210. Thus, as shown in FIG. 5A, FIG. 5B, and FIG. 6A, the source, channel region, and the drain of transistor T2 of memory cell 210 can be formed from a single piece of the same material (or alternatively, a single piece of the same combination of materials), such as material 520. Therefore, the source, the drain, and the channel region of transistor T2 of memory cell 210 can be formed from the same material (e.g., material 520) of the same conductivity type (e.g., either n-type or p-type). Other memory cells of memory device 200 can also include material 520 like memory cell 210.

Material 520 can include a structure (e.g., a piece (e.g., a layer)) of semiconductor material. In the example where transistor T2 is an NFET (as described above), material 520 can include n-type semiconductor material (e.g., n-type silicon).

In another example, the semiconductor material that forms material 520 can include a structure (e.g., a piece) of oxide material. Examples of the oxide material used for material 520 include semiconducting oxide materials, transparent conductive oxide materials, and other oxide materials.

As an example, material 520 can include at least one of zinc tin oxide (ZTO), indium zinc oxide (IZO), zinc oxide ($ZnO_x$), indium gallium zinc oxide (IGZO), indium gallium silicon oxide (IGSO), indium oxide ($InO_x$, $In_2O_3$), tin oxide ($SnO_2$), titanium oxide (TiOx), zinc oxide nitride ($Zn_xO_yN_z$), magnesium zinc oxide ($Mg_xZn_yO_z$), indium zinc oxide ($In_xZn_yO_z$), indium gallium zinc oxide ($In_xGa_yZn_zO_a$), zirconium indium zinc oxide ($Zr_xIn_yZn_zO_a$), hafnium indium zinc oxide ($Hf_xIn_yZn_zO_a$), tin indium zinc oxide ($Sn_xIn_yZn_zO_a$), aluminum tin indium zinc oxide ($Al_xSn_yIn_zZn_aO_d$), silicon indium zinc oxide ($Si_xIn_yZn_zO_a$), zinc tin oxide ($Zn_xSn_yO_z$), aluminum zinc tin oxide ($Al_xZn_ySn_zO_a$), gallium zinc tin oxide ($Ga_xZn_ySn_zO_a$), zirconium zinc tin oxide ($Zr_xZn_ySn_zO_a$), indium gallium silicon oxide (InGaSiO), and gallium phosphide (GaP).

Using the materials listed above in memory device 200 provides improvement and benefits for memory device 200. For example, during a read operation, to read information from a selected memory cell (e.g., memory cell 210), charge from charge storage structure 202 of the selected memory cell may leak to transistor T2 of the selected memory cell. Using the material listed above for the channel region (e.g., material 520) of transistor T2 can reduce or prevent such a leakage. This improves the accuracy of information read from the selected memory cell and improves the retention of information stored in the memory cells of the memory device (e.g., memory device 200) described herein.

The materials listed above are examples of material 520. However, other materials (e.g., a relatively high band-gap material) different from the above-listed materials can be used.

As shown in FIG. 5A, FIG. 5B, and FIG. 6A, material 520 and charge storage structure 202 of memory cell 210 can be electrically coupled (e.g., directly coupled) to each other, such that material 520 can contact charge storage structure 202 of memory cell 210 without an intermediate material (e.g., without a conductive material) between charge storage structure 202 of memory cell 210 and material 520. In an alternative structure (not shown), material 520 can be electrically coupled to charge storage structure 202 of memory cell 210, such that material 520 is not directly coupled to (not contacting) charge storage structure 202 of memory cell 210, but material 520 is coupled to (e.g., indirectly contacting) charge storage structure 202 of memory cell 210 through an intermediate material (e.g., a conductive material) between charge storage structure 202 of memory cell 210 and material 520.

As shown in FIG. 5A, FIG. 5B, and FIG. 6A, memory cell 210 can include a portion 510, which can include a structure (e.g., a piece (e.g., a layer)) of semiconductor material. Example materials for portion 510 can include silicon, polysilicon (e.g., undoped or doped polysilicon), germanium, silicon-germanium, or other semiconductor materials, and semiconducting oxide materials (oxide semiconductors, e.g., SnO or other oxide semiconductors).

As described above with reference to FIG. 2, transistor T1 of memory cell 210 includes a channel region (e.g., read channel region). In FIG. 5A, FIG. 5B, and FIG. 6A, the channel region of transistor T1 of memory cell 210 can include (e.g., can be formed from) portion 510. Portion 510 can be electrically coupled to data line 271. As described above with reference to FIG. 2, memory cell 210 can include a read path. In FIG. 5A, FIG. 5B, and FIG. 6A, portion 510 (e.g., the read channel region of transistor T1 of memory cell 210) can be part of the read path of memory cell 210 that can carry a current (e.g., read current) during a read operation of reading information from memory cell 210. For example, during a read operation, to read information from memory cell 210, portion 510 can conduct a current (e.g., read current) between data line 271 and ground connection 297 (through part of semiconductor material 596). The direction of the read current can be from data line 271 to ground connection 297 (through portion 510 and part of semiconductor material 596). In the example where transistor T1 is a PFET and transistor T2 is an NFET, the material that forms portion 510 can have a different conductivity type from material 520. For example, portion 510 can include p-type semiconductor material (e.g., p-type silicon) regions, and material 520 can include n-type semiconductor material (e.g., n-type gallium phosphide (GaP)) regions.

As shown in FIG. 5A, FIG. 5B, and FIG. 6A, memory cell 210 can include dielectric materials 515A and 515B. Dielectric materials 515A and 515B can be gate oxide regions that electrically separate each of charge storage structure 202 and material 520 from portion 510. Dielectric materials 515A and 515B can also electrically separate charge storage structure 202 from semiconductor material 596.

Example materials for dielectric materials 515A and 515B include silicon dioxide, hafnium oxide (e.g., $HfO_2$), aluminum oxide (e.g., $Al_2O_3$), or other dielectric materials. In an example structure of memory device 200, dielectric materials 515A and 515B include a high-k dielectric material (e.g., a dielectric material having a dielectric constant greater than the dielectric constant of silicon dioxide). Using such a high-k dielectric material (instead of silicon dioxide) can improve the performance (e.g., reduce current leakage, increase drive capability of transistor T1, or both) of memory device 200.

As shown in FIG. 6A, the memory cells (e.g., memory cells 210, 211, 216, and 217) of memory device 200 can share (e.g., can electrically couple to) semiconductor material 596. For example, the read channel regions of the memory cells (e.g., portion 510 of each of memory cells 210, 211, 216, and 217) of memory device 200 can contact (e.g., can be electrically coupled to) semiconductor material 596.

As shown in FIG. 5A, FIG. 5B, and FIG. 6A, memory device 200 can include a conductive region 597 (e.g., a common conductive plate) under the memory cells (e.g., memory cells 210, 211, 216, and 217 in FIG. 6A) of memory device 200. Conductive region 597 can include at least one of the materials (e.g., doped polysilicon) of semiconductor material 596 and the material (e.g., metal or doped polysilicon) of ground connection 297. For example, conductive region 597 can include the material of semiconductor material 596, the material of ground connection 297, or the combination of the materials of semiconductor material 596 and ground connection 297. Thus, as shown FIG. 6A, the memory cells (e.g., memory cells 210, 211, 216, and 217) of memory device 200 can share conductive region 597 (which can include any combination of semiconductor material 596 and ground connection 297).

As shown in FIG. 6A, memory device 200 can include conductive structures 503Y, each of which can be located (e.g., formed) between two respective adjacent memory cells (e.g., between memory cells 210 and 211 or between memory cells 216 and 217). Memory device 200 can include dielectric materials (e.g., silicon dioxide) 545A, 545B, and 545C to electrically separate (e.g., isolate) conductive structure 503Y from semiconductor material 596 and from charge storage structures 202 respective memory cells 210.

As shown in FIG. 6A, each conductive structure 503Y can include an edge (e.g., top edge) 503Y'. FIG. 6A shows an example where edge 503Y' is at a specific distance (e.g., distance shown in FIG. 6A) from edges 541'. However, the distance between edge 503Y' of conductive structure 503Y and edges 541' of portions 541F and 541B may vary. For example, FIG. 6A shows edges 541' are below edge 503Y' with respect to the Z-direction. However, edges 541' can alternatively be above edge 503Y' with respect to the Z-direction.

Conductive structure 503Y (FIG. 6A) can be a shield (e.g., a capacitive coupling isolation structure) between adjacent charge storage structures 202 of adjacent memory cells. For example, conductive structure 503Y between memory cells 210 and 211 (adjacent memory cells) can be a shield between charge storage structures 202 of memory cells 210 and 211. In another example, conductive structure 503Y (FIG. 6A) between memory cells 216 and 217 (adjacent memory cells) can be a shield between charge storage structures 202 of memory cells 261 and 217.

Including conductive structure 503Y (e.g., a capacitive coupling isolation structure) between adjacent charge storage structures (e.g., charge storage structures 202) of adjacent memory cells of memory device 200 can reduce capacitive coupling between adjacent charge storage structures of adjacent memory cells. A reduction in capacitive coupling between adjacent charge storage structures can improve operation (e.g., improve read signal margin) of memory device 200.

Conductive structure 503Y can include metal, polysilicon (e.g., conductively doped polysilicon), or other conductive material (or a combination of conductive materials). The conductively doped polysilicon used for conductive structure 503Y can be either polysilicon of n-type conductivity (e.g., heavily doped n-type polysilicon (N+polysilicon)) or polysilicon of p-type conductivity (e.g., heavily doped p-type polysilicon (P+polysilicon)).

As shown in FIG. 5A and FIG. 5B, part of portion 541F can be adjacent part of portion 510 and part of material 520 and can span across (e.g., overlap in the X-direction) part of portion 510 and part of material 520. As described above, portion 510 can form part of read channel region of transistor T1 and material 520 can form part of write channel region of transistor T2. Thus, as shown in FIG. 5A and FIG. 5B, part of portion 541F can span across (e.g., overlap) part of (e.g., on a side (e.g., front side) in the Y-direction) both read and write channels of transistors T1 and T2, respectively. Similarly, part of portion 541B can be adjacent portion 510 and a part of material 520, and can span across (e.g., overlap in the X-direction) part of (e.g., on another side (e.g., back side opposite from the front side) in the Y-direction) portion 510 and a part of material 520. As shown in FIG. 7, each of portions 541F and 541B of access line 241 can also span across (e.g., overlap in the X-direction) part of portion 510 (e.g., a portion of the read channel region of transistor T1) and part of material 520 (e.g., a portion of write channel region of transistor T2) of other memory cells (e.g., memory cells 211, 216, and 217) of memory device 200. The spanning (e.g., overlapping) of access line 241 across portion 510 and material 520 allows access line 241 (a single access line) to control (e.g., to turn on or turn off) both transistors T1 and T2 of memory cells 210, 211, 216, and 217.

As shown in FIG. 6A, memory device 200 can include dielectric material (e.g., silicon dioxide) 526 that can form a structure (e.g., a dielectric) to electrically separate (e.g., isolate) parts of two adjacent (in the X-direction) memory cells of memory device 200. For example, dielectric material 526 between memory cells 210 and 211 can electrically separate material 520 (e.g., write channel region of transistor T2) of memory cell 210 from material 520 (e.g., write channel region of transistor T2) of memory cell 211, and electrically separate charge storage structure 202 of memory cell 210 from charge storage structure 202 of memory cell 211.

As shown in FIG. 6A, memory device 200 can include dielectric portions 555. Portion (e.g., read channel) 510 of two adjacent memory cells (e.g., memory cells 211 and 216) can be electrically separated from each other by one of dielectric portions 555. Some of portions (e.g., materials) of the memory cells of memory device 200 can be formed adjacent (e.g., formed on) a side wall (e.g., vertical portion with respect to the Z-direction) of a respective dielectric portion among dielectric portions 555. For example, as shown in FIG. 6A, portion 510 (e.g., semiconductor material portion) of memory cell 210 can be formed adjacent (e.g., formed on) a side wall (not labeled) of dielectric portion 555 (on the left of memory cell 210). In another example, portion 510 (e.g., semiconductor material portion) of memory cell 211 can be formed adjacent (e.g., formed on) a side wall (not labeled) of dielectric portion 555 between memory cells 211 and 216.

As shown in FIG. 6B, memory device 200 can include dielectric materials 518F and 518B (e.g., oxide regions) to electrically separate portions 541F and 541B of access line 241 from other elements (e.g., from portion 510), charge storage structure 202, and material 520 of memory cell 210. The material (or materials) for dielectric materials 518F and 518B can be the same as (or alternatively, different from) the material (or materials) of dielectric materials 515A and 515B. Example materials for portions 518F and 518B can include silicon dioxide, hafnium oxide (e.g., $HfO_2$), aluminum oxide (e.g., $Al_2O_3$), or other dielectric materials.

As shown in FIG. 6B, portions 541F and 541B can be adjacent respective sides of material 520 and charge storage structure 202 of memory cell 210. For example, portion 541F can be adjacent a side (e.g., right side in the X-direction in the view of FIG. 6B) of a portion of each of material 520 and charge storage structure 202. In another example, portion 541B can be adjacent another side (e.g., left side (opposite from the right side) in the X-direction in the view of FIG. 6B) of a portion of each of material 520 and charge storage structure 202.

The above description focuses on the structure of memory cell 210. Other memory cells (e.g., memory cells 211, 216, and 217 in FIG. 6A) of memory device 200 can include elements structured in ways similar or identical to the elements of memory cell 210, described above. For example, as shown in FIG. 6A, memory cell 211 can include charge storage structure 202, channel region (e.g., write channel region) 520, portion 510 (e.g., read channel region), and dielectric materials 525A and 525B. The material (or materials) for dielectric materials 525A and 525B can the same as the material (or materials) for dielectric materials 515A and 515B.

FIG. 7A shows a top view of a portion of memory device 200 of FIG. 6A. FIG. 7B and FIG. 7C show different views taken along lines 7B-7B and 7C-7C, respectively, of FIG. 7A. As shown in FIG. 7B, conductive structure 503Y can be electrically separated from semiconductor material 596 by dielectric material 545C, as also described above with reference to FIG. 6A. As shown in FIG. 7C, portions 510 (e.g., read channels) of respective memory cells 210, 212, and 214 can contact (e.g., can be electrically coupled to) data line 271 and semiconductor material 596.

As shown in FIG. 7A, the memory cells (e.g., memory cells 211 through 221) can be arranged in a matrix (or matrix-like) pattern, such that each of the memory cells can have an adjacent a memory cell (e.g., neighbor memory cell) in one direction (e.g., X-direction) and another adjacent memory cell (e.g., another neighbor memory cell) in another direction (e.g., Y-direction). For example, memory cell 211 is adjacent memory cell 210 in the X-direction), and memory cell 212 is adjacent memory cell 210 in Y-direction.

As shown in FIG. 7A, each of conductive structures 503Y of memory device 200 can extend continuously (e.g., can have a length) in the Y-direction between charge storage structures 202 of respective memory cells. For example, conductive structure 503Y (between memory cells 210 and 211) can extend continuously in the Y-direction between charge storage structures 202 of memory cells 210 and 211, between charge storage structures 202 of memory cells 212 and 213, and between charge storage structures 202 of memory cells 214 and 215. In another example, conductive structure 503Y (between memory cells 216 and 217) can extend continuously in the Y-direction between charge storage structures 202 of memory cells 216 and 217, between charge storage structures 202 of memory cells 218 and 219, and between charge storage structures 202 of memory cells 220 and 221.

As shown in FIG. 7A, memory device 200 can include conductive paths 503P coupled to conductive structures 503Y and a node 503N. For simplicity, conductive paths 503P are shown as lines in FIG. 7A. However, conductive paths 503P can include a conductive structure that can have conductive materials, which can be the same as (or different from) the material (or materials) of conductive structures 503Y. Node 503N can be part of a conductive region that can be structured to receive a voltage Vshield_Y. During operations of memory device 200, voltage Vshield_Y can have a constant voltage value (e.g., ground potential (e.g., 0V) or a positive value). As mention above, conductive structures 503Y can reduce capacitive coupling between adjacent charge storage structures 202 of adjacent memory cells of memory device 200. However, separating conductive structures 503Y from semiconductor material 596 (as shown in FIG. 6A) and providing voltage Vshield_Y with a constant value (or a relatively constant value) can boost the capacitance of charge storage structures 202. This can further improve operation (e.g., further improve read signal margins) of memory device 200.

The connection and structure of memory device 200 as described above can allow a cross-point operation in that a memory cell (e.g., memory cell 210) of memory device 200 can be accessed using a single access line (e.g., access line 241) and a single data line (e.g., data line 271) during an operation (e.g., a read or write operation) of memory device 200. Such a cross-point operation can be achieved due in part to a terminal (e.g., a source terminal) of transistor T1 of each of the memory cells (e.g., memory cell 210 through 215) being coupled to a ground connection (e.g., ground connection 297). This ground connection allows a voltage level at a terminal (e.g., source terminal) of transistor T1 of a selected memory cell to remain unchanged (e.g., remain unswitched at 0V), thereby allowing the cross-point operation. The cross-point operation and the structure of memory device 200 can provide better memory performance in comparison with some conventional volatile memory devices (e.g., DRAM devices).

FIG. 8A through FIG. 8D shows a memory device 800 including conductive structures 503Y and conductive structures 891, 892, 893, and 894, according to some embodiments described herein. Memory device 800 can include elements similar to or the same as the elements of memory device 200 described above with reference to FIG. 2 through FIG. 7D. For simplicity, descriptions of similar or the same elements between memory devices 200 and 800 are given the same labels and their descriptions are not repeated.

Figure 8A:
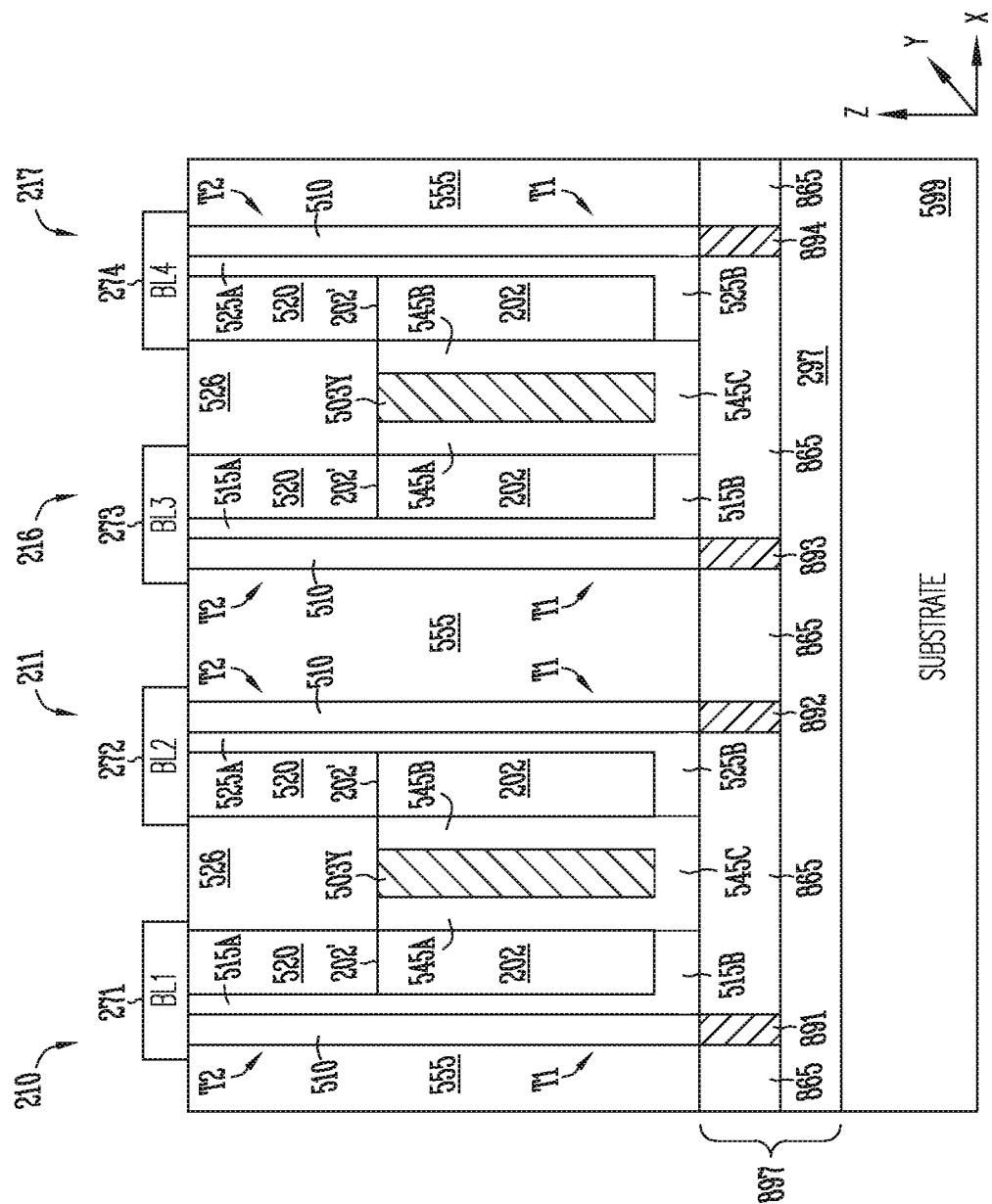
FIG. 8A through FIG. 8D show a memory device including conductive structures extending in the Y-direction and separate conductive regions coupled to respective transistor channels, according to some embodiments described herein.
Figure 8B:
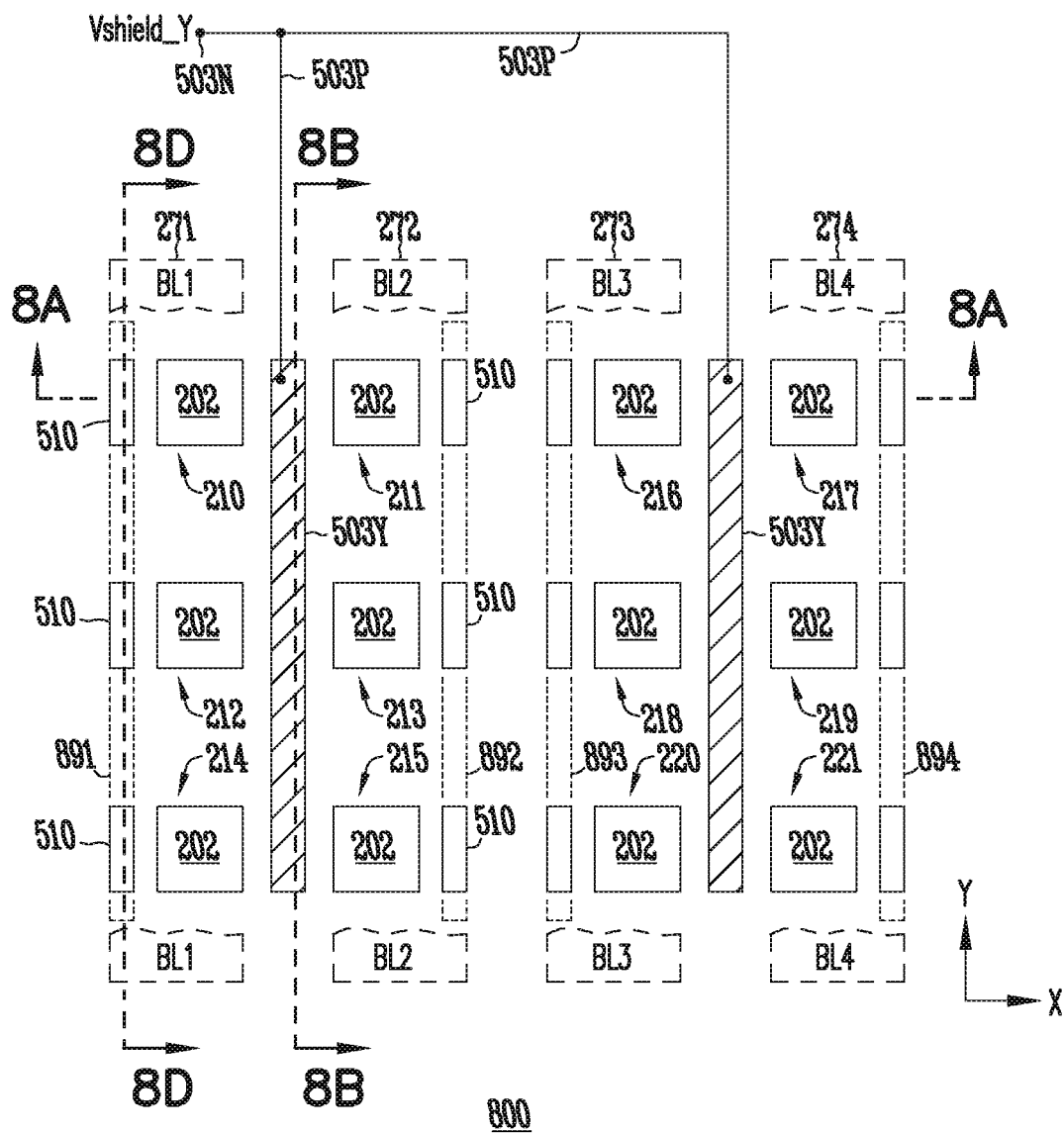
Figure 8C:
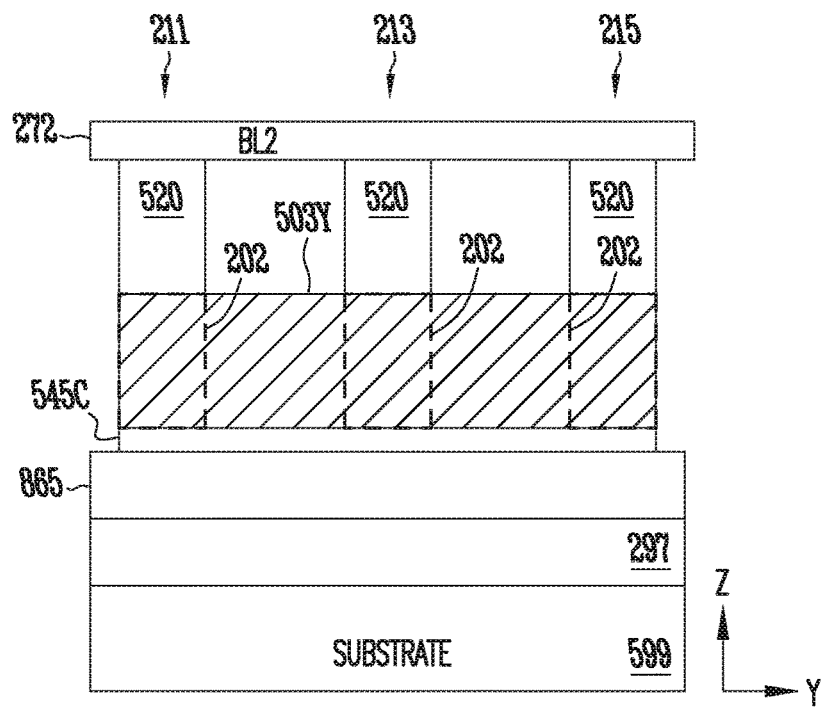
Figure 8D:
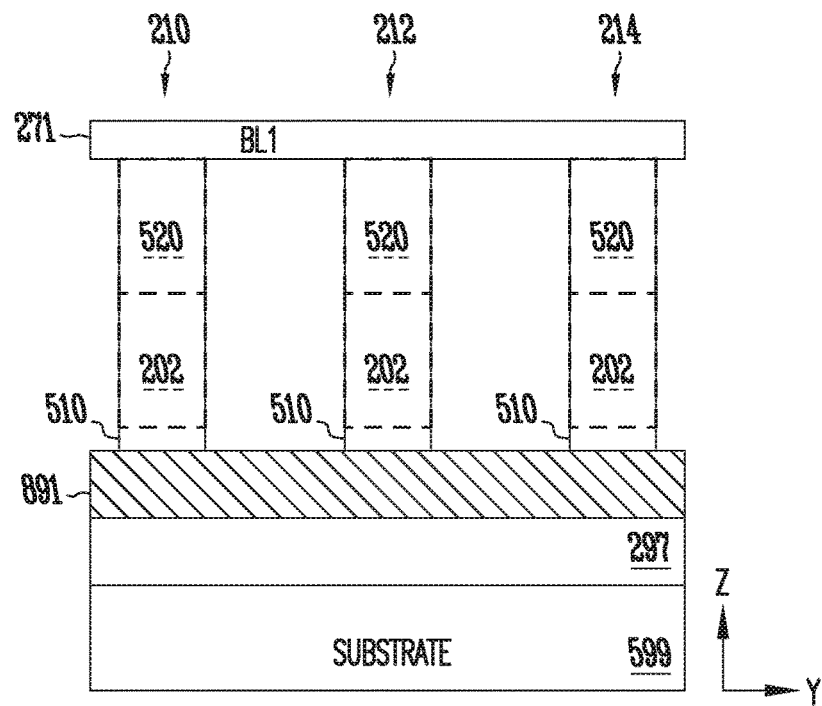

FIG. 8A shows a side view (e.g., cross-sectional view) of memory device 800 that can be similar to the side view of memory device 200 of FIG. 6A. FIG. 8B shows a top view (e.g., plan view) of a portion of memory device 800 of FIG. 8A. FIG. 8B and FIG. 8C show different views (e.g., cross-sectional views) taken along lines 8B-8B and 8C-8C, respectively, of FIG. 8A. For simplicity, some of elements (e.g., access lines) of memory device 800 are omitted from FIG. 8A through FIG. 8D. As shown in FIG. 8A and FIG. 8C, memory device 800 can have structure 503Y (extending in the Y-direction) described with reference to FIG. 5A through FIG. 7C.

Differences between memory devices 200 and 800 include conductive structures 891, 892, 893, and 894 (FIG. 8A and FIG. 8B) in memory device 800 and dielectric materials (e.g., silicon dioxides) 865 electrically separating conductive structures 891, 892, 893, and 894 from each other. Conductive structures 891, 892, 893, and 894 can be part of a conductive region 897, which is similar to conductive region 597 of FIG. 6A. However, unlike conductive region 597 that includes a region (e.g., semiconductor material 596) shared by (e.g., common to) the read channel regions (e.g., portions 510) of the memory cells of memory device 200 (FIG. 6A), conductive structures 891, 892, 893, and 894 of FIG. 8A may not be shared by (e.g., is not common to) portions 510 of the memory cells of memory device 800. As shown in FIG. 8A, portions 510 of the memory cells of memory device 800 can be separately coupled to respective conductive structures 891, 892, 893, and 894.

As shown in FIG. 8B, each of conductive structures 891, 892, 893, and 894 can be located have a length extending in the Y direction (e.g., the same as the direction of the lengths of data lines 271, 272, 273, and 274). Conductive structures 891, 892, 893, and 894 can include respective conductive regions that can be formed from a semiconductor material, which can include a doped region (e.g., p-type doped region). Alternatively, conductive structures 891, 892, 893, and 894 can include other conductive materials (e.g., metal).

As shown in FIG. 8B, portions 510 of memory cells (in the Y-direction) that shared a data line (one of data lines 271, 272, 273, and 274) can be coupled to a respective conductive structure among conductive structures 891, 892, 893, and 894. For example, as shown in in FIG. 8B and FIG. 8D, portions 510 of memory cells 210, 212 and 214 that shared data line 271 can be coupled to conductive structure 891. Portions 510 of other memory cells of memory device 800 can be coupled to a respective conductive structure among conductive structures 892, 893, and 894, as shown in FIG. 8B.

FIG. 8A shows an example where ground connection 297 can include a single conductive region coupled to conductive structures 891, 892, 893, and 894. However, in an alternative structure of memory device 800, ground connection 297 be separated (e.g., patterned) into portions (e.g., four portions) below (e.g., directly below) and electrically coupled to respective conductive materials among conductive structures 891, 892, 893, and 894. In such an alternative structure, memory device 800 can include dielectric materials (e.g., like dielectric materials 865) between respective portions of ground connection 297.

Figure 9A:
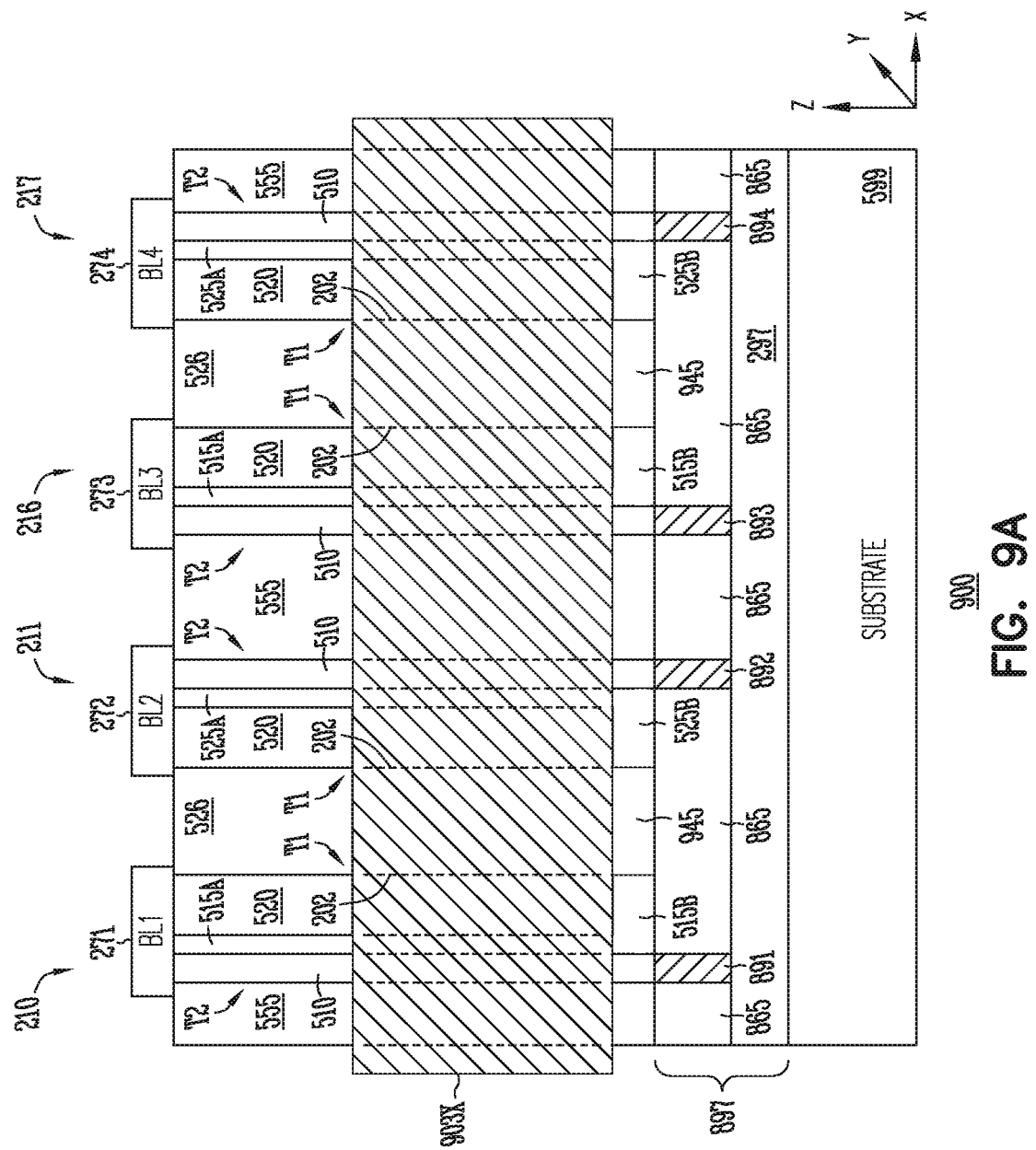
FIG. 9A through FIG. 9D show a memory device including conductive structures extending in the X-direction, according to some embodiments described herein.
Figure 9B:
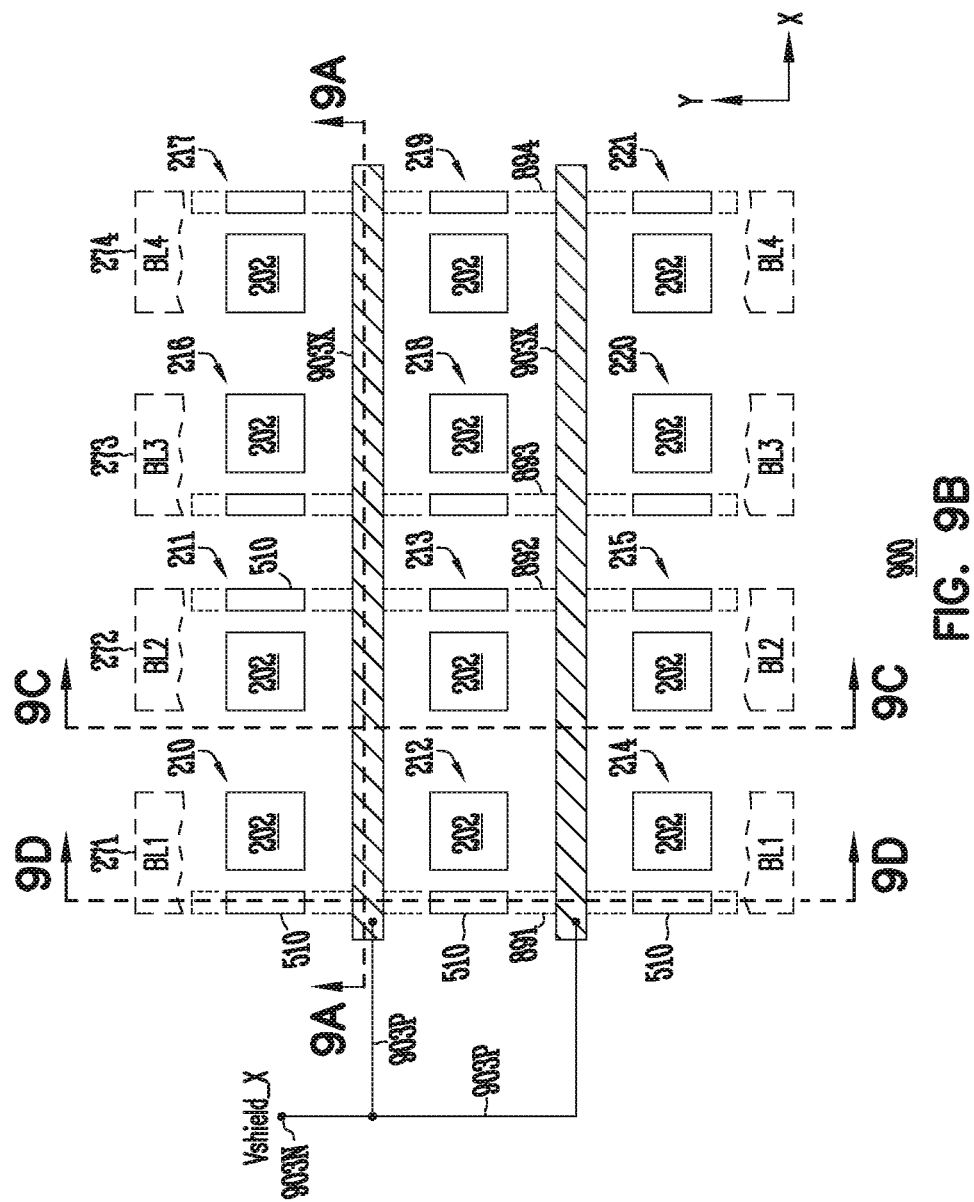
Figure 9C:
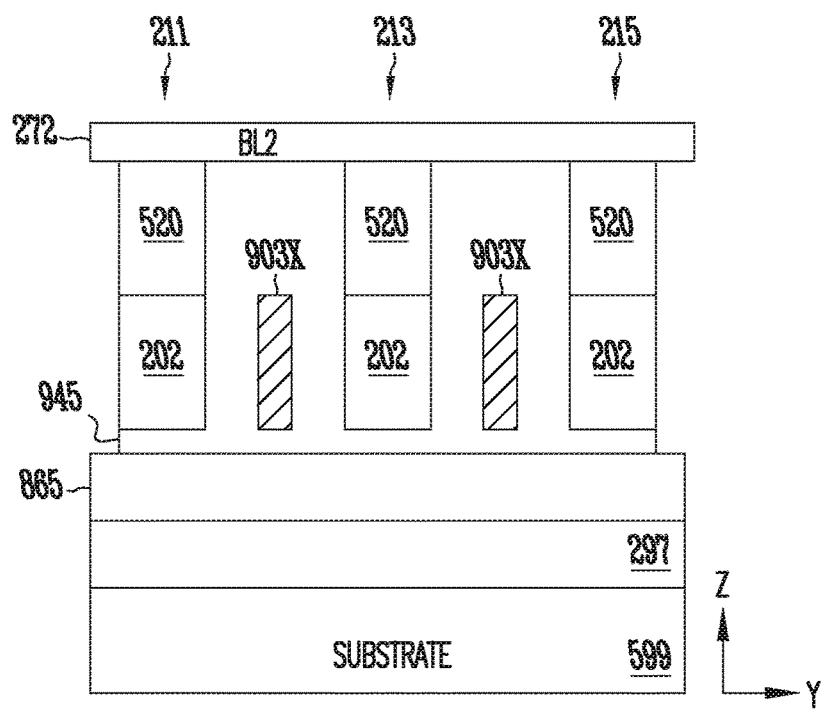

FIG. 9A through FIG. 9D shows a memory device 900 including conductive structures 903X extending the X-direction, according to some embodiments described herein. FIG. 9A shows a side view (e.g., cross-sectional view) of memory device 900 that can be similar to the side views of memory devices 200 and 800 of FIG. 6A and FIG. 8A, respectively. FIG. 9B shows a top view (e.g., plan view) of a portion of memory device 900 of FIG. 9A. FIG. 9B and FIG. 9C show different views (e.g., cross-sectional views) taken along lines 9B-9B and 9C-9C, respectively, of FIG. 9A. For simplicity, some of elements (e.g., access lines) of memory device 900 are omitted from FIG. 9A through FIG. 9D.

As shown in FIG. 9A through FIG. 9D, memory device 900 includes elements similar to (or the same as) the elements of memory devices 200 and 800. For simplicity, similar or the same elements between memory devices 200, 800, and 900 are given the same labels and their descriptions are not repeated.

Differences between memory devices 200 and 900 include conductive structures 903X in memory device 900. As shown in FIG. 9A and FIG. 9B, memory device 900 is void of (does not include) conductive structures in the Y-direction (e.g., void of conductive structures 503Y). However, memory device 900 can include conductive structures 903X in the X-direction. As a comparison, memory device 200 is void of (does not include) conductive structures in the X-direction like conductive structures 903X of memory device 900. The material (or materials) of conductive structures 903X can be the same as (or different from) the material (or materials) of conductive structures 503Y.

As shown in FIG. 9B. each of conductive structures 903X of memory device 200 can extend continuously (e.g., can have a length) in the X-direction between charge storage structures 202 of respective memory cells of memory device 900. For example, conductive structure 903X between memory cells 210 and 212 can extend continuously in the Y-direction between charge storage structures 202 of memory cells 210 and 212, between charge storage structures 202 of memory cells 211 and 213, between charge storage structures 202 of memory cells 216 and 218, and between charge storage structures 202 of memory cells 217 and 219. In another example, conductive structure 903X between memory cells 212 and 214 can extend continuously in the Y-direction between charge storage structures 202 of memory cells 212 and 214, between charge storage structures 202 of memory cells 213 and 215, between charge storage structures 202 of memory cells 218 and 220, and between charge storage structures 202 of memory cells 219 and 221.

As shown in FIG. 9C, conductive structures 903X can be electrically separated from ground connection 297 by dielectric materials 945 and 865. Dielectric materials 945 and 865 can have the same dielectric material (e.g., silicon dioxide) of different dielectric materials.

Figure 9D:
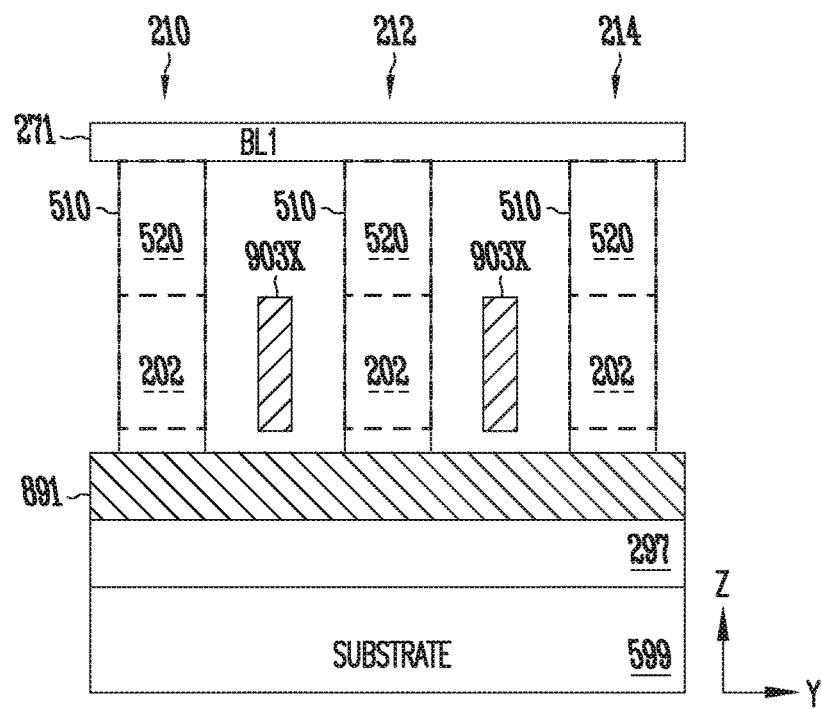

As shown in FIG. 9B and FIG. 9D, like memory device 800 of FIG. 8B, portions 510 of memory cells (in the Y-direction) of memory device 900 that shared a data line (one of data lines 271, 272, 273, and 274) can be coupled to a respective conductive structure (e.g., a conductive region) among conductive structures 891, 892, 893, and 894. For example, as shown in in FIG. 9B and FIG. 9D, portions 510 of memory cells 210, 212 and 214 that shared data line 271 can be coupled to conductive structure 891. As shown in FIG. 9B, portions 510 of other memory cells of memory device 900 can be coupled to a respective conductive structure among conductive structures 892, 893, and 894.

FIG. 9A shows an example where ground connection 297 can include a single conductive region coupled to conductive structures 891, 892, 893, and 894. However, in an alternative structure of memory device 900, ground connection 297 be separated (e.g., patterned) into portions (e.g., four portions) below (e.g., directly below) and electrically coupled to respective conductive materials among conductive structures 891, 892, 893, and 894. In such an alternative structure, memory device 900 can include dielectric materials (e.g., like dielectric materials 865) between respective portions of ground connection 297.

FIG. 9A and FIG. 9B show portions 510 (e.g., read channels) of the memory cells of memory device 900 being coupled to respective conductive structures 891, 892, 893, and 894 of memory device 900. In an alternative structure, conductive structures 891, 892, 893, and 894 can be replaced with a conductive region (e.g., a single region like semiconductor material 596 of FIG. 6A of memory device 200). In such an alternative structure, portions 510) of the memory cells of memory device 900 can be coupled to the same region, which can be similar to or the same as semiconductor material 596 of FIG. 6A of memory device 200.

As shown in FIG. 9A, memory device 900 can include conductive paths 903P coupled to conductive structures 903X and a node 903N. For simplicity, conductive paths 903P are shown as lines in FIG. 9A. However, conductive paths 90P can include a conductive structure that can have conductive materials, which can be the same as (or different from) the material (or materials) of conductive structures 903X. Node 903N can be part of a conductive region that can be structured to receive a voltage Vshield_X. During operations of memory device 200, voltage Vshield_X can have a constant voltage value (e.g., ground potential (e.g., 0V) or a positive value). Like conductive structure 503Y of memory devices 200 and 800 described above, conductive structures 903Y of memory device 900 can reduce capacitive coupling between adjacent charge storage structures 202 of adjacent memory cells of memory device 900 to improve operation (e.g., improve read signal margins) of memory device 200. Further, providing voltage Vshield_Y with a constant value (or a relatively constant value) can boost the capacitance of charge storage structures 202 of memory device 900. This can further improve operation (e.g., further improve read signal margins) of memory device 900.

Figure 10A:
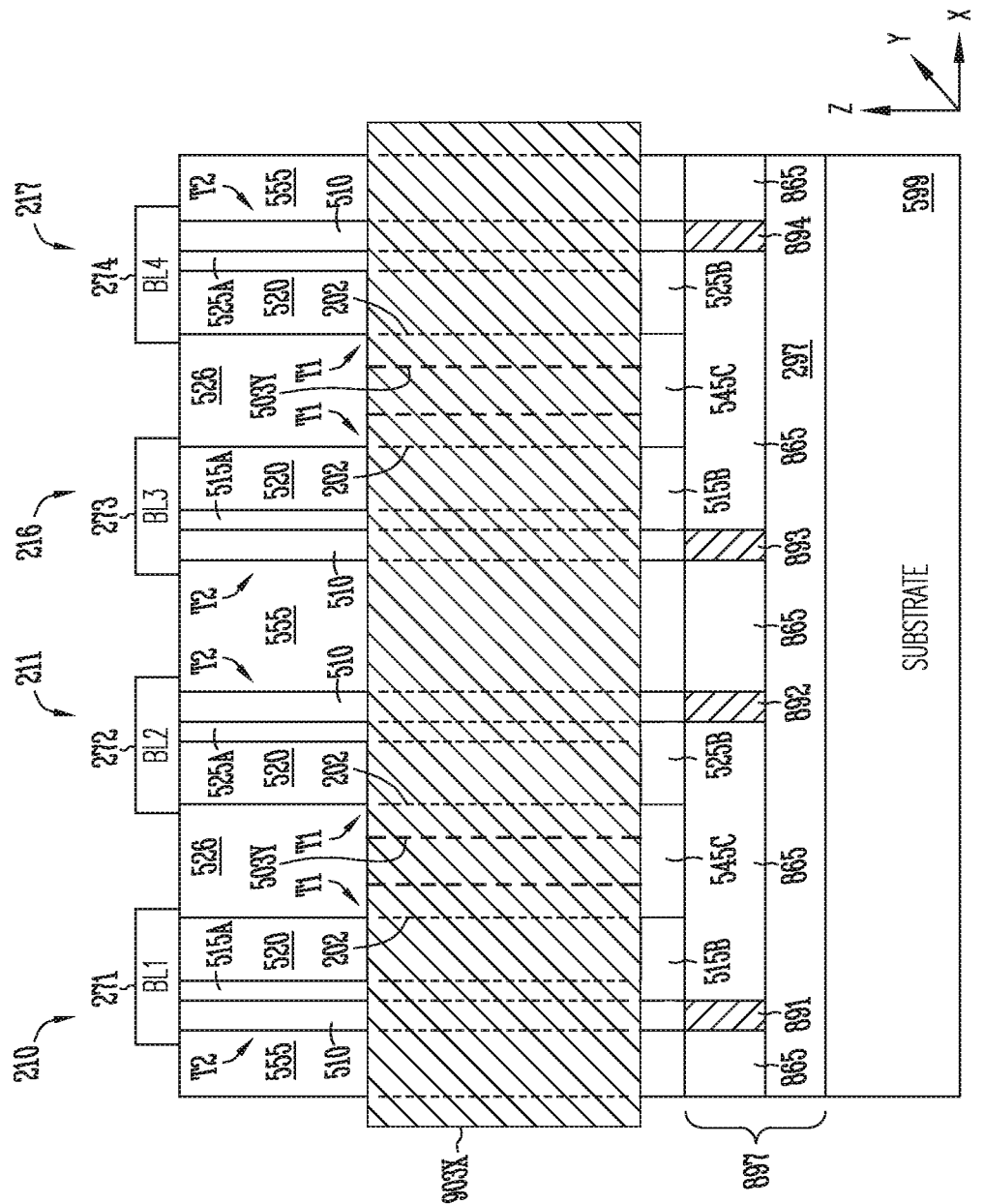
FIG. 10A through FIG. 10D show a memory device including conductive structures extending in the Y-direction, and conductive structures extending in the X-direction, according to some embodiments described herein.
Figure 10B:
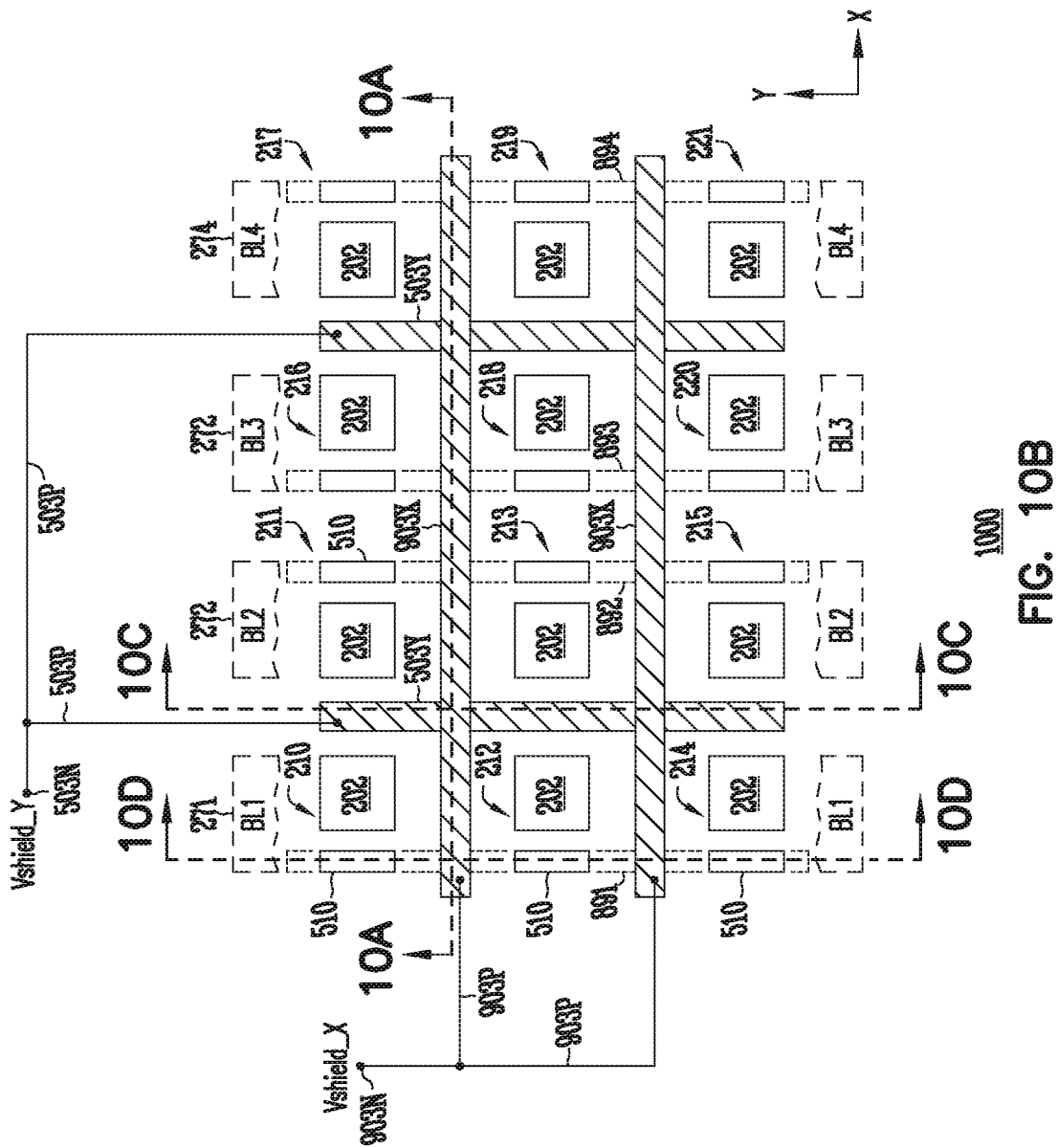
Figure 10C:
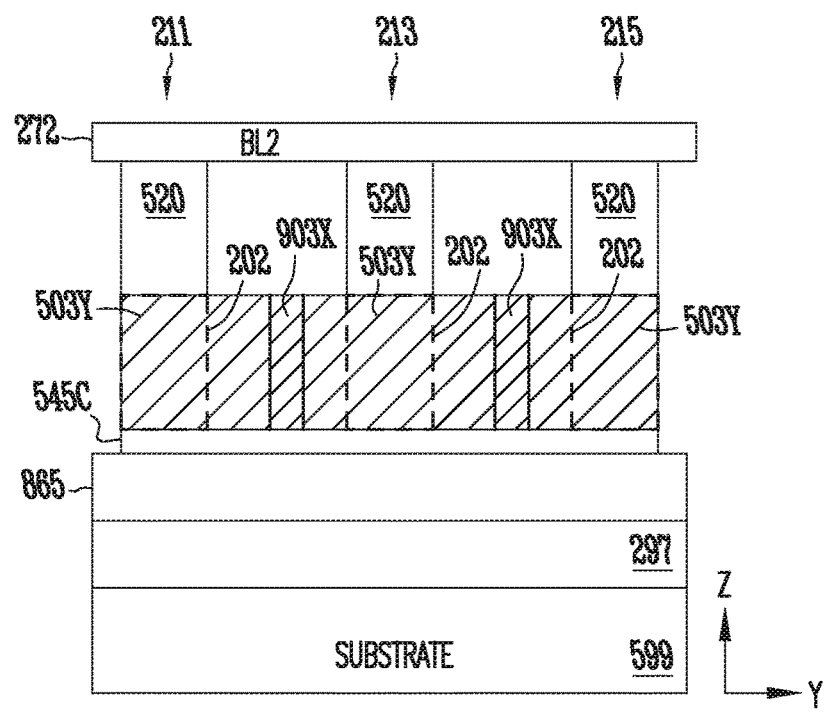
Figure 10D:
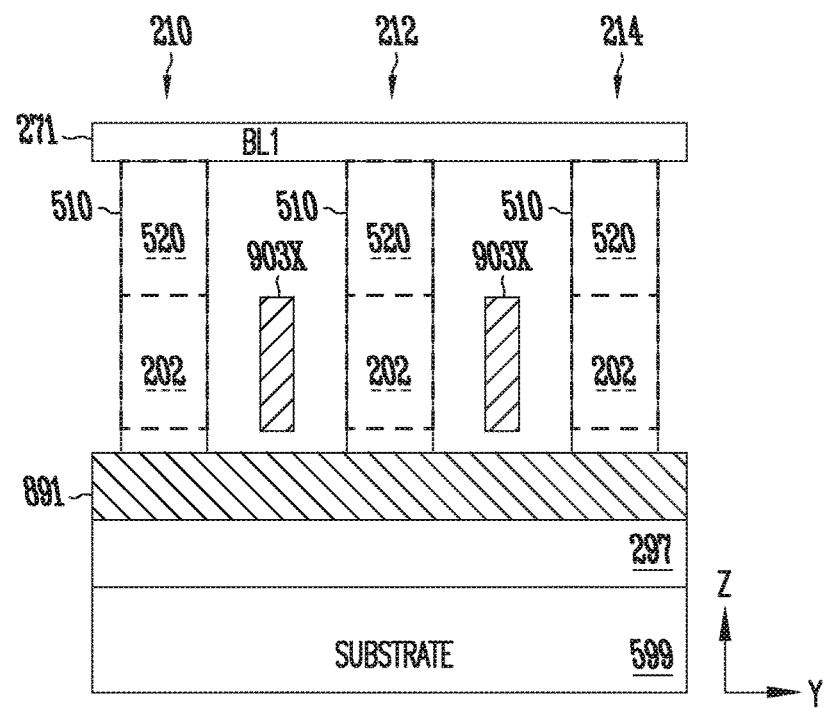

FIG. 10A through FIG. 10D shows a memory device 1000 including conductive structures 503Y extending the Y-direction, and conductive structures 903X extending the X-direction, according to some embodiments described herein. FIG. 10A shows a side view (e.g., cross-sectional view) of memory device 1000 that can be similar to the side views of memory devices 800 and 900 of FIG. 8A and FIG. 9A, respectively. FIG. 10B shows a top view (e.g., plan view) of a portion of memory device 1000 of FIG. 10A. FIG. 10B and FIG. 10C show different views (e.g., cross-sectional views) taken along lines 10B-10B and 10C-10C, respectively, of FIG. 10A. For simplicity, some of elements (e.g., access lines) of memory device 1000 are omitted from FIG. 10A through FIG. 10D.

As shown in FIG. 10A through FIG. 10D, memory device 1000 includes elements similar to (or the same as) the elements of memory device 800 (FIG. 8A through FIG. 8D) and memory device 900 (FIG. 9A through FIG. 9D). For example, as shown in FIG. 10B, memory device 1000 include both conductive structures 503Y and 903X that are included in memory devices 800 and 900, respectively. For simplicity, similar or the same elements between memory devices 800, 900, and 1000 are given the same labels and their descriptions are not repeated.

As shown in FIG. 10B, conductive structures 503Y and 903X can extend in directions (e.g., the Y-direction and the X-direction, respectively) that are perpendicular to each other. Conductive structures 503Y and 903X can contact each other (e.g., can be electrically. Voltages Vshield_X and Vshield_Y can have the same value during operations of memory device 1000. For example, voltages Vshield_X and Vshield_Y can be ground potential (e.g., 0V) or can have the same positive value.

As shown in FIG. 10C, conductive structures 503Y and 903X can have a same height in the Z-direction. Alternatively, conductive structures 503Y and 903X can have different heights in the Z-direction.

FIG. 10A shows an example where ground connection 297 can include a single conductive region coupled to conductive structures 891, 892, 893, and 894. However, in an alternative structure of memory device 1000, ground connection 297 be separated (e.g., patterned) into portions (e.g., four portions) below (e.g., directly below) and electrically coupled to respective conductive materials among conductive structures 891, 892, 893, and 894. In such an alternative structure, memory device 1000 can include dielectric materials (e.g., like dielectric materials 865) between respective portions of ground connection 297.

FIG. 10A and FIG. 10B show portions 510 (e.g., read channels) of the memory cells of memory device 1000 being coupled to respective conductive structures 891, 892, 893, and 894 of memory device 1000. In an alternative structure, conductive structures 891, 892, 893, and 894 can be replaced with a conductive region (e.g., a single region like semiconductor material 596 of FIG. 6A of memory device 200). In such an alternative structure, portions 510) of the memory cells of memory device 1000 can be coupled to the same region, which can be similar to or the same as semiconductor material 596 of FIG. 6A of memory device 200.

In FIG. 10B, voltages Vshield_X and Vshield_Y can have the same value (or different values) during operations of memory device 1000. Conductive structures 503Y and 903X can allow memory device 1000 to have improvements and benefits (e.g., improvements in read signal margin) like memory devices 800 and 900 described above.

Figure 11A:
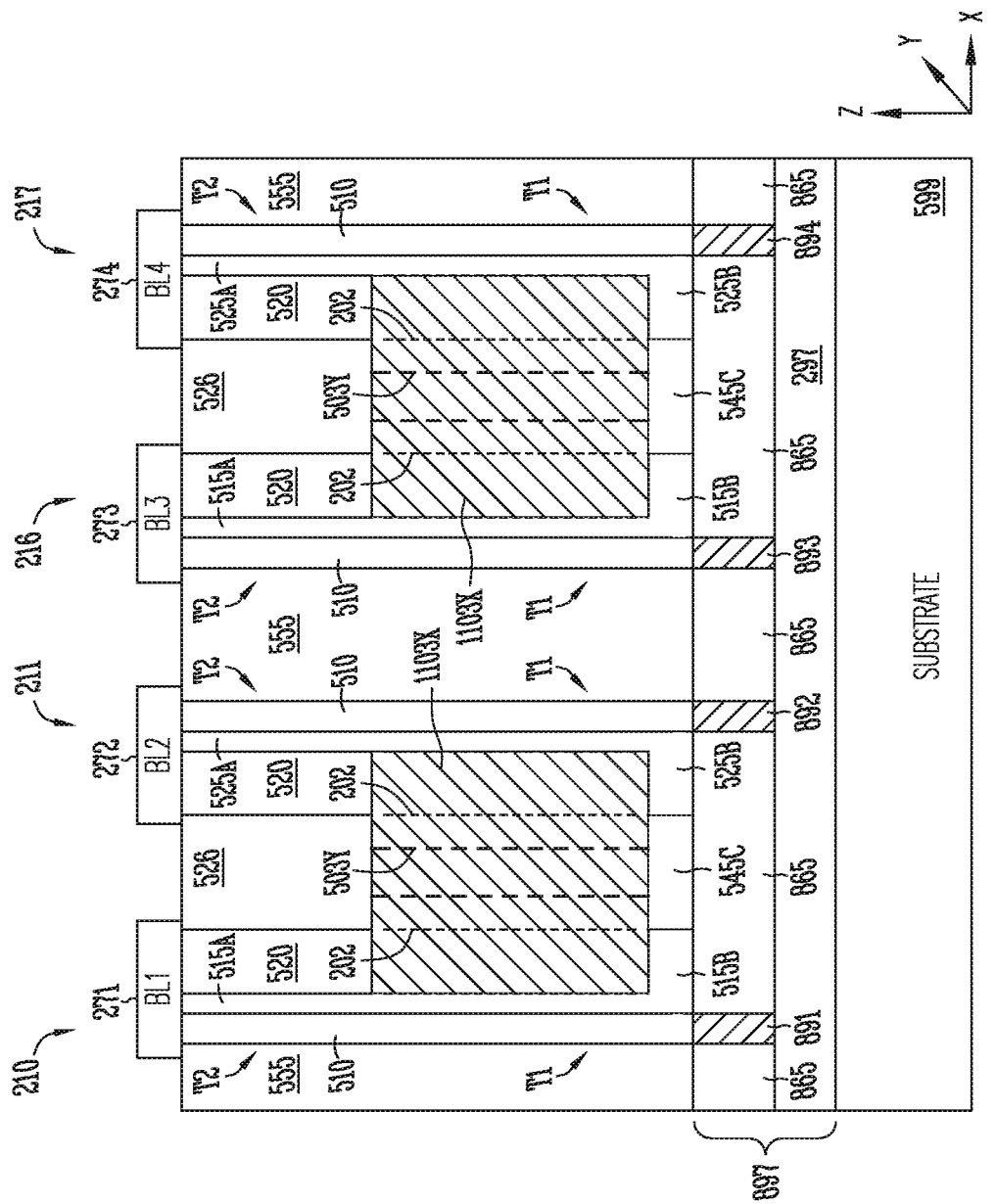
FIG. 11A through FIG. 11D show a memory device including conductive structures extending in the Y-direction, and discontinuous conductive structures extending in the X-direction, according to some embodiments described herein.
Figure 11B:
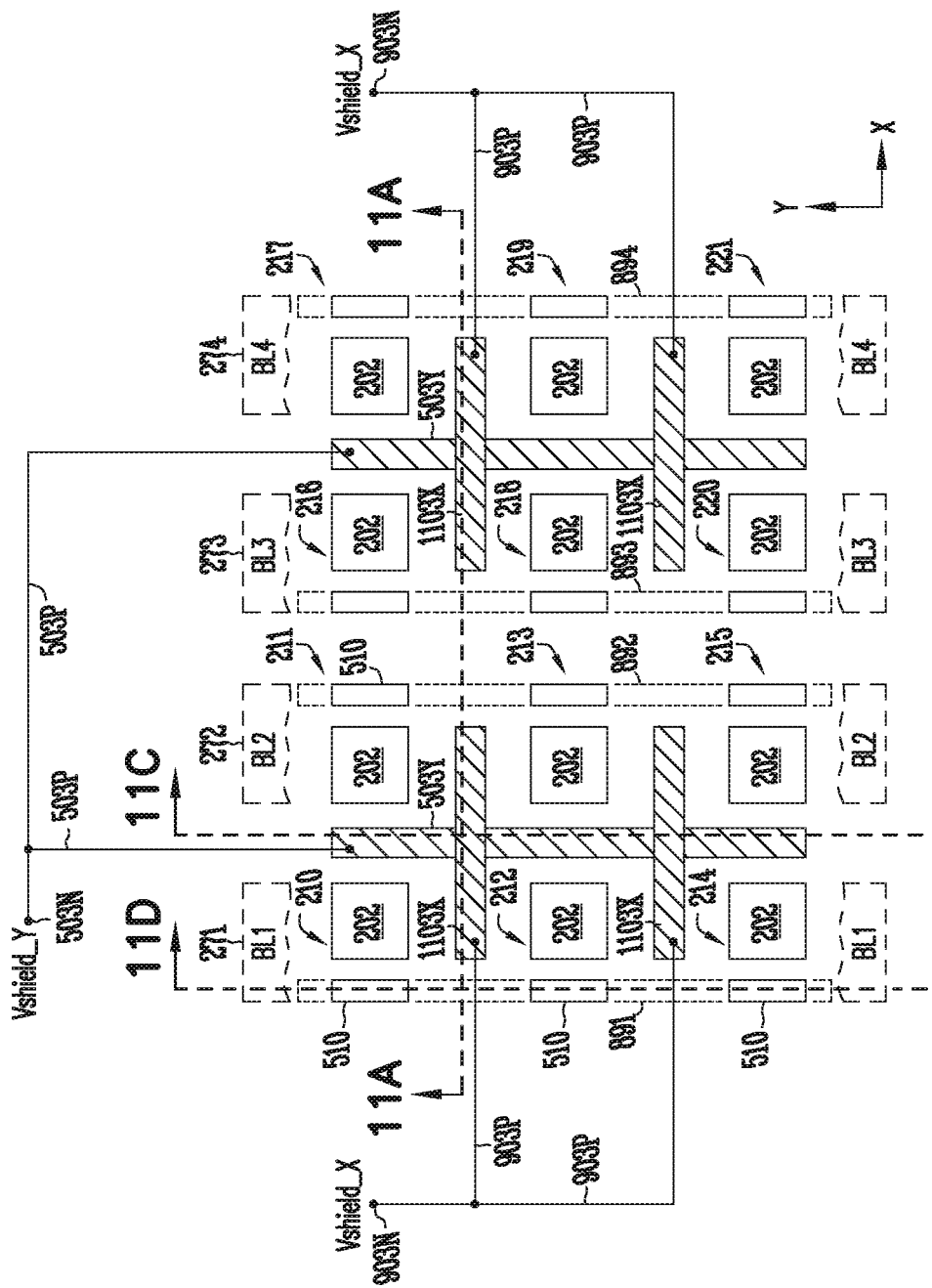
Figure 11C:
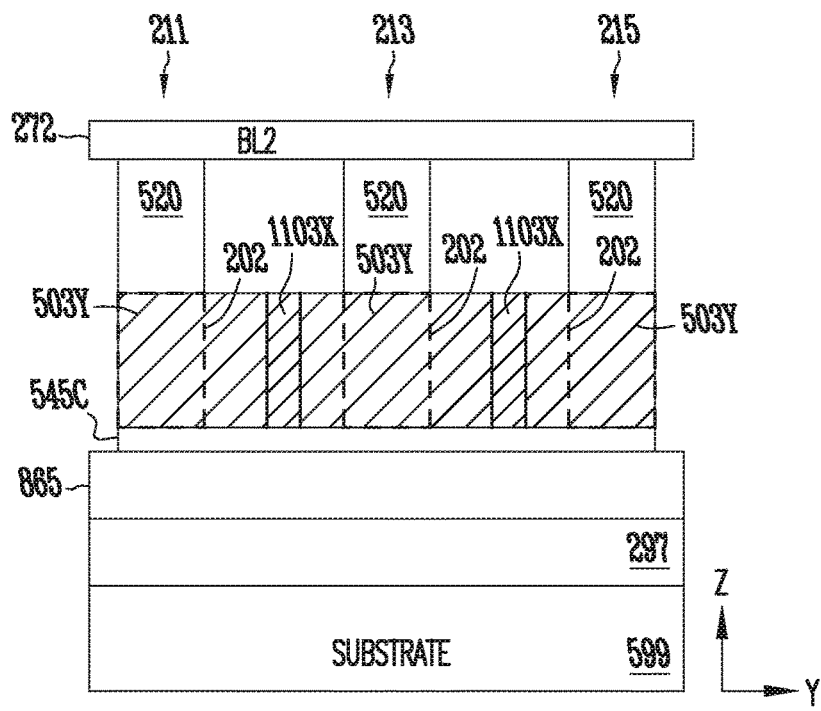
Figure 11D:
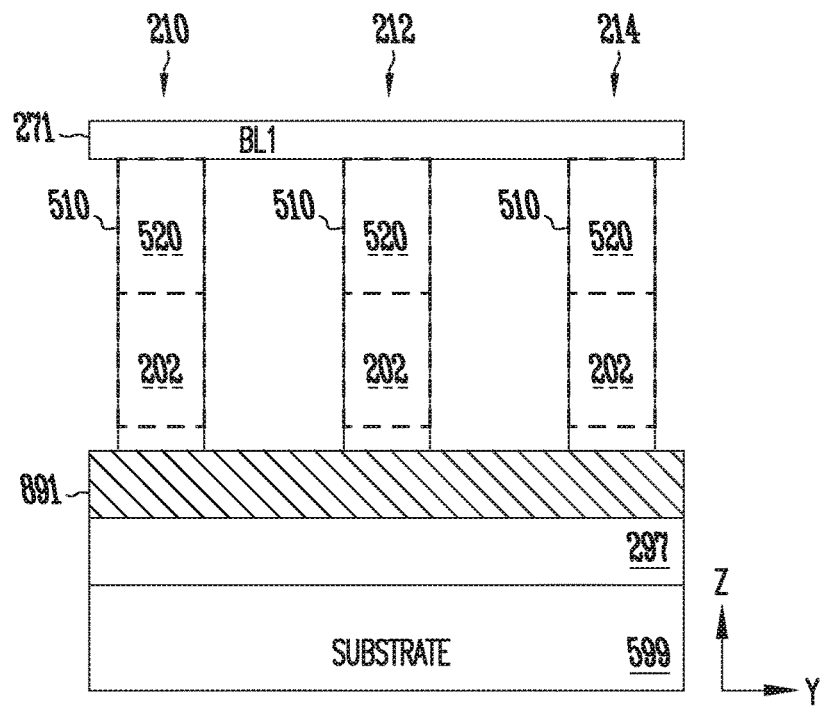

FIG. 11A through FIG. 11D shows a memory device 1100 including conductive structures 503Y extending the Y-direction, and conductive structures 1103X extending the X-direction, according to some embodiments described herein. FIG. 11A shows a side view (e.g., cross-sectional view) of memory device 1100 that can be similar to the side view of memory device 1000 of FIG. 10A. FIG. 11B shows a top view (e.g., plan view) of a portion of memory device 1100 of FIG. 11A. FIG. 11B and FIG. 11C show different views (e.g., cross-sectional views) taken along lines 11B-11B and 11C-11C, respectively, of FIG. 11A. For simplicity, some of elements (e.g., access lines) of memory device 1100 are omitted from FIG. 11A through FIG. 11D.

As shown in FIG. 11A through FIG. 11D, memory device 1100 includes elements similar to (or the same as) the elements of memory device 1000. For example, as shown in FIG. 11B, memory device 1100 can include conductive structures (e.g., conductive structures 503Y) extending in the Y-direction and conductive structures (e.g., conductive structures 1103X) extending in the X-direction. The material (or materials) of conductive structures 1103X can be the same as (or different from) the material (or materials) of conductive structures 903X (FIG. 9B).

Unlike conductive structures 903X of memory device 1000 of FIG. 9B, conductive structures 1103X of memory device 1100 of FIG. 11B may not extend continuously between charge storage structures 202 of some of the memory cells of memory device 1100. For example, conductive structure 1103X between memory cells 210 and 212 and between memory cells 211 and 213 can extend in the X-direction, but it may not extend outside the boundaries (e.g., edges) of portions (e.g., read channels) 510 of memory cells of 210 and 212 and outside the boundaries (e.g., edges) of portions (e.g., read channels) 510 of memory cells of 212 and 213. In another example, conductive structure 1103X between memory cells 216 and 218 and between memory cells 217 and 219 can extend in the X-direction but it may not extend outside the boundaries (e.g., edges) of portions (e.g., read channels) 510 of memory cells of 216 and 218 and outside the boundaries (e.g., edges) of portions (e.g., read channels) 510 of memory cells of 217 and 219.

FIG. 11B shows an example where the length (in the X-direction) of each conductive structure 1103X extends to the edges of respective charge storage structures 202. However, the length of each conductive structure 1103X can be a variable length. For example, unlike the length shown in FIG. 11B, the length of each conductive structure 1103X may not extend to the edges of respective charge storage structures 202. As an example, the length of conductive structure 1103X between memory cells 210 and 212 and between memory cells 211 and 213 may extend to about half way (or more than or less than half way but not to the edges) in the X-direction between charge storage structures 202 of memory cells of 210 and 212. In another example, the length of conductive structure 1103X between memory cells 210 and 212 and between memory cells 211 and 213 may extend only about half way (or more than or less than halfway but not to the edges) in the X-direction between charge storage structures 202 of memory cells of 211 and 213.

FIG. 11A shows an example where ground connection 297 can include a single conductive region coupled to conductive structures 891, 892, 893, and 894. However, in an alternative structure of memory device 1100, ground connection 297 be separated (e.g., patterned) into portions (e.g., four portions) below (e.g., directly below) and electrically coupled to respective conductive materials among conductive structures 891, 892, 893, and 894. In such an alternative structure, memory device 1100 can include dielectric materials (e.g., like dielectric materials 865) between respective portions of ground connection 297.

FIG. 11A and FIG. 11B show portions 510 (e.g., read channels) of the memory cells of memory device 1100 being coupled to respective conductive structures 891, 892, 893, and 894 of memory device 1100. In an alternative structure, conductive structures 891, 892, 893, and 894 can be replaced with a conductive region (e.g., a single region like semiconductor material 596 of FIG. 6A of memory device 200). In such an alternative structure, portions 510) of the memory cells of memory device 1100 can be coupled to the same region, which can be similar to or the same as semiconductor material 596 of FIG. 6A of memory device 200.

As shown in FIG. 11B, memory device 1100 can include conductive paths 503P and node 503N like memory device 1000 of FIG. 10B. Conductive paths 903P and nodes 903N can be similar to or the same as those of memory device 1000 of FIG. 10B. Conductive structures 503Y and 1103X can allow memory device 1100 to have improvements and benefits (e.g., improvements in read signal margin) like memory devices 1000 described above.

Figure 12A:
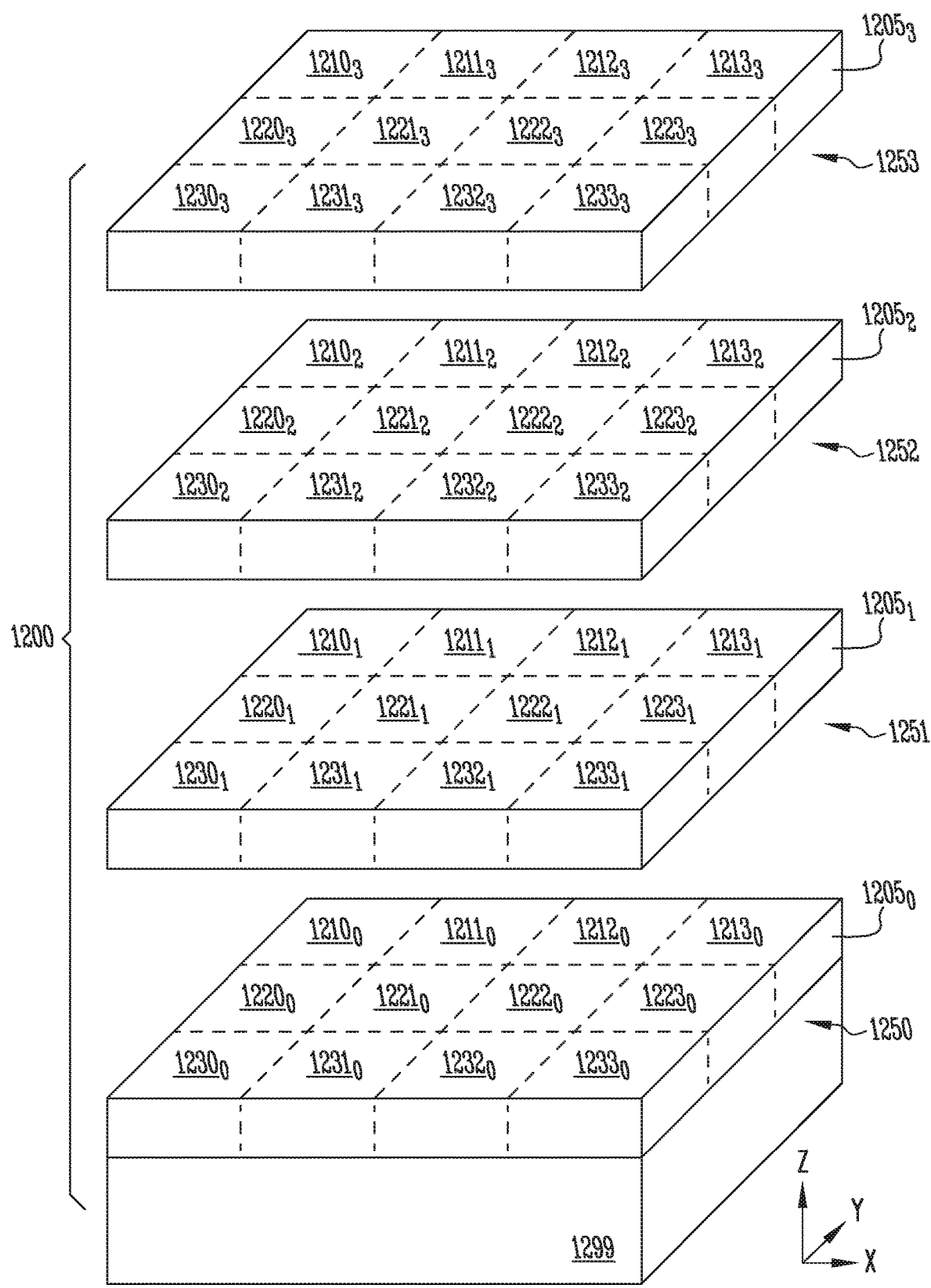
FIG. 12A, FIG. 12B, and FIG. 12C show different views of a structure of a memory device including multiple decks of memory cells, according to some embodiments described herein.
Figure 12B:
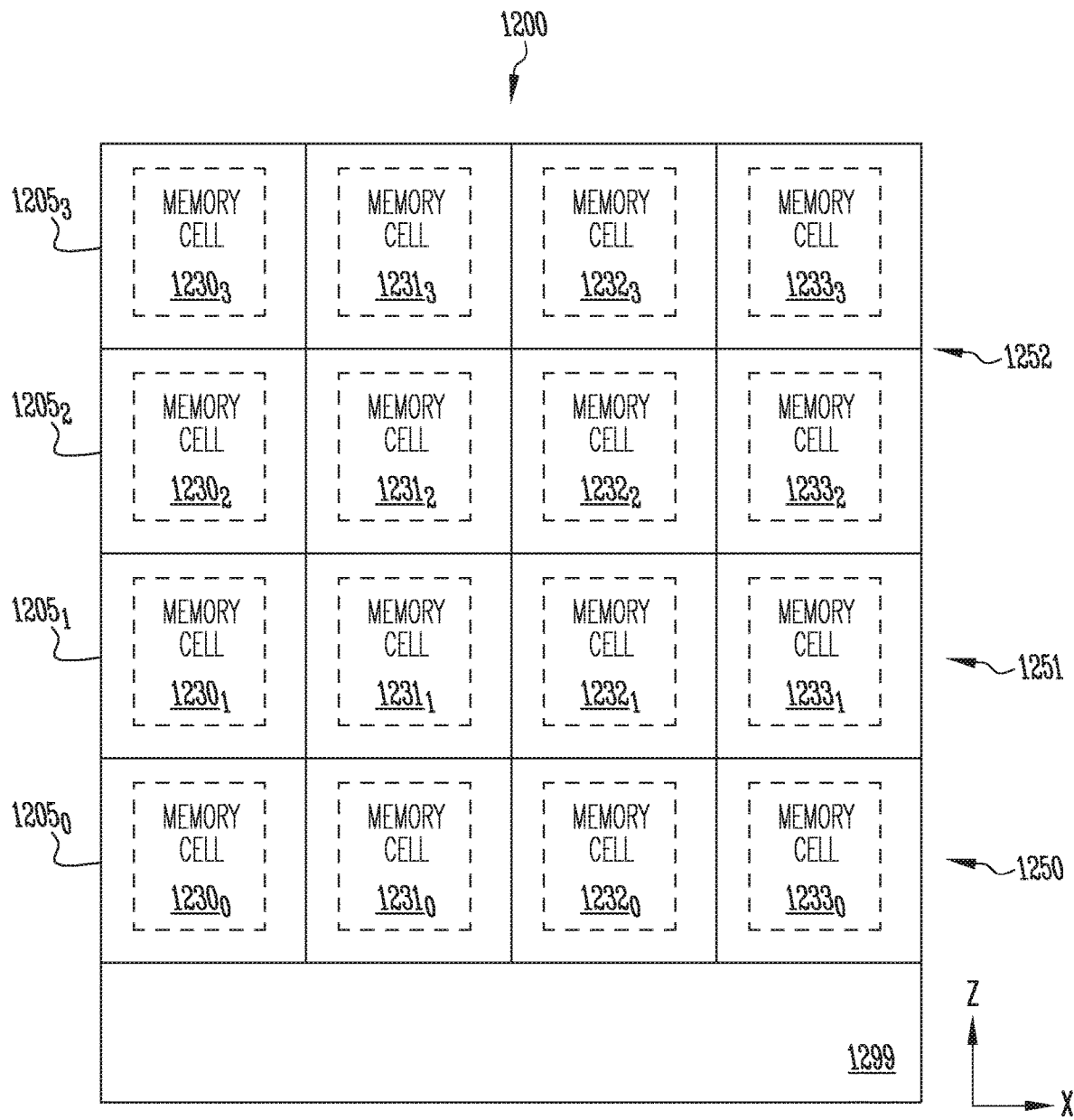
Figure 12C:
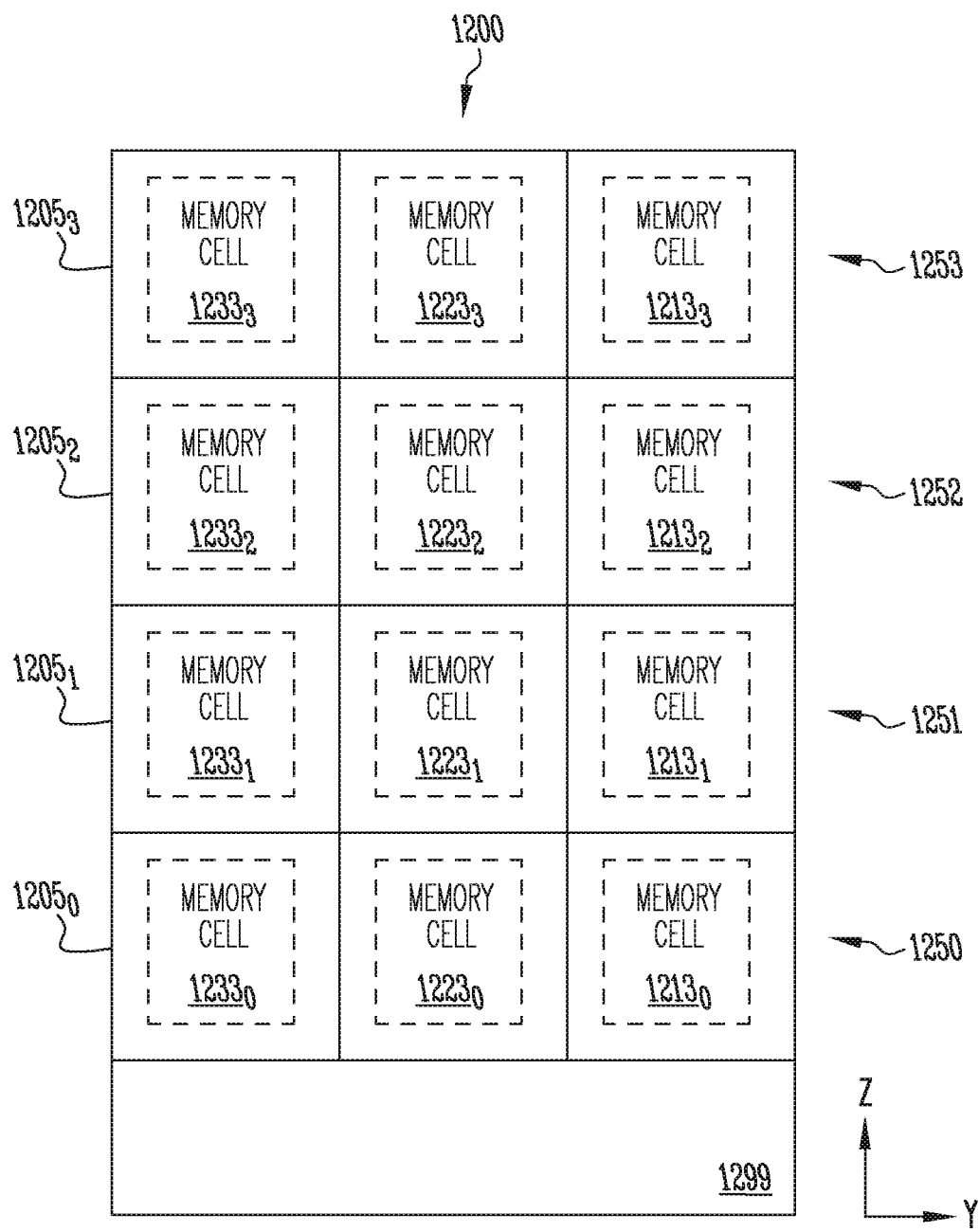

FIG. 12A, FIG. 12B, and FIG. 12C show different views of a structure of a memory device 1200 including multiple decks of memory cells, according to some embodiments described herein. FIG. 12A shows an exploded view (e.g., in the Z-direction) of memory device 1200. FIG. 12B shows a side view (e.g., cross-sectional view) in the X-direction and the Z-direction of memory device 1200. FIG. 12C shows a side view (e.g., cross-sectional view) in the Y-direction and the Z-direction of memory device 1200.

As shown in FIG. 12A, memory device 1200 can include decks (decks of memory cells) 1205$_0$, 1205$_1$, 1205$_2$, and 1205$_3$ that are shown separately from each other in an exploded view to help ease of viewing the deck structure of memory device 1200. In reality, decks 1205$_0$, 1205$_1$, 1205$_2$, and 1205$_3$ can be attached to each other in an arrangement where one deck can be formed (e.g., stacked) over another deck over a substrate (e.g., a semiconductor (e.g., silicon) substrate) 1299. For example, as shown in FIG. 12A, decks 1205$_0$, 1205$_1$, 1205$_2$, and 1205$_3$ can be formed in the Z-direction perpendicular to substrate 1299 (e.g., formed vertically in the Z-direction with respect to substrate 1299).

As shown in FIG. 12A, each of decks 1205$_0$, 1205$_1$, 1205$_2$, and 1205$_3$ can have memory cells arranged in the X-direction and the Y-direction (e.g., arranged in rows in the X-direction and in columns in the Y-direction). For example, deck 1205$_0$ can include memory cells 1210$_0$, 1211$_0$, 1212$_0$, and 1213$_0$ (e.g., arranged in a row), memory cells 1220$_0$, 1221$_0$, 1222$_0$, and 1223$_0$ (e.g., arranged in a row), and memory cells 1230$_0$, 1231$_0$, 1232$_0$, and 1233$_0$ (e.g., arranged in a row).

Deck 1205$_1$ can include memory cells 1210$_1$, 1211$_1$, 1212$_1$, and 1213$_1$ (e.g., arranged in a row), memory cells 1220$_1$, 1221$_1$, 1222$_1$, and 1223$_1$ (e.g., arranged in a row), and memory cells 1230$_1$, 1231$_1$, 1232$_1$, and 1233$_1$ (e.g., arranged in a row).

Deck 1205$_2$ can include memory cells 1210$_2$, 1211$_2$, 1212$_2$, and 1213$_2$ (e.g., arranged in a row), memory cells 1220$_2$, 1221$_2$, 1222$_2$, and 1223$_2$ (e.g., arranged in a row), and memory cells 1230$_2$, 1231$_2$, 1232$_2$, and 1233$_2$ (e.g., arranged in a row).

Deck 1205$_3$ can include memory cells 1210$_3$, 1211$_3$, 1212$_3$, and 1213$_3$ (e.g., arranged in a row), memory cells 1220$_3$, 1221$_3$, 1222$_3$, and 1223$_3$ (e.g., arranged in a row), and memory cells 1230$_3$, 1231$_3$, 1232$_3$, and 1233$_3$ (e.g., arranged in a row).

As shown in FIG. 12A, decks 1205$_0$, 1205$_1$, 1205$_2$, and 1205$_3$ can be located (e.g., formed vertically in the Z-direction) on levels (e.g., portions) 1250, 1251, 1252, and 1253, respectively, of memory device 1200. The arrangement of decks 1205$_0$, 1205$_1$, 1205$_2$, and 1205$_3$ forms a 3-dimensional (3-D) structure of memory cells of memory device 1200 in that different levels of the memory cells of memory device 1200 can be located (e.g., formed) in different levels (e.g., different vertical portions) 125$_0$, 125$_1$, 125$_2$, and 125$_3$ of memory device 1200.

Decks 1205$_0$, 1205$_1$, 1205$_2$, and 1205$_3$ can be formed one deck at a time. For example, decks 1205$_0$, 1205$_1$, 1205$_2$, and 1205$_3$ can be formed sequentially in the order of decks 1205$_0$, 1205$_1$, 1205$_2$, and 1205$_3$ (e.g., deck 1205$_1$ is formed first and deck 1205$_3$ is formed last). In this example, the memory cell of one deck (e.g., deck 1205$_1$) can be formed either after formation of the memory cells of another deck (e.g., deck 1205$_0$) or before formation of the memory cells of another deck (e.g., deck 1205$_2$). Alternatively, decks 1205$_0$, 1205$_1$, 1205$_2$, and 1205$_3$ can be formed concurrently (e.g., simultaneously), such that the memory cells of decks 1205$_0$, 1205$_1$, 1205$_2$, and 1205$_3$ can be concurrently formed. For example, the memory cells in levels 125$_0$, 125$_1$, 125$_2$, and 125$_3$ of memory device 1200 can be concurrently formed.

The structures decks 1205$_0$, 1205$_1$, 1205$_2$, and 1205$_3$ can include the structures of memory devices 200, 800, 900, 1000, and 1100 described above with reference to FIG. 1 through FIG. 11D. For example, the structures of the memory cells of decks 1205$_0$, 1205$_1$, 1205$_2$, and 1205$_3$ can include the structure of the memory cells and conductive structures (e.g., capacitive coupling isolation structures) 503Y, 903X, and 1103X of respective memory devices 200, 800, 900, 1000, and 1100, described above.

Memory device 1200 can include data lines (e.g., bit lines) and access lines (e.g., word lines) to access the memory cells of decks 1205$_0$, 1205$_1$, 1205$_2$, and 1205$_3$. For simplicity, data lines and access lines of memory cells are omitted from FIG. 12A. However, the data lines and access lines of memory device 1200 can be similar to the data lines and access lines, respectively, of the memory devices described above with reference to FIG. 1 through FIG. 11D.

FIG. 12A shows memory device 1200 including four decks (e.g., 1205$_0$, 1205$_1$, 1205$_2$, and 1205$_3$) as an example. However, the number of decks can be different from four. FIG. 12A shows each of decks 1205$_0$, 1205$_1$, 1205$_2$, and 1205$_3$ including one level (e.g., layer) of memory cells as an example. However, at least one of the decks (e.g., one or more of decks 1205$_0$, 1205$_1$, 1205$_2$, and 1205$_3$) can have two (or more) levels of memory cells. FIG. 12A shows an example where each of decks 1205$_0$, 1205$_1$, 1205$_2$, and 1205$_3$ includes four memory cells (e.g., in a row) in the X-direction and three memory cells (e.g., in a column) in the Y-direction. However, the number of memory cells in a row, in a column, or both, can vary. Since memory device 1200 can include the structures of memory devices 200, 800, 900, 1000, and 1100, memory device 1200 can also have improvements and benefits like memory devices 200, 800, 900, 1000, and 1100.

The illustrations of apparatuses (e.g., memory devices 100, 200, 800, 900, 1000, 1100, and 1200) and methods (e.g., operations of memory devices 100 and 200) are intended to provide a general understanding of the structure of various embodiments and are not intended to provide a complete description of all the elements and features of apparatuses that might make use of the structures described herein. An apparatus herein refers to, for example, either a device (e.g., any of memory devices 100, 200, 800, 900, 1000, 1100, and 1200) or a system (e.g., an electronic item that can include any of memory devices 100, 200, 800, 900, 1000, 1100, and 1200).

Any of the components described above with reference to FIG. 1 through FIG. 12C can be implemented in a number of ways, including simulation via software. Thus, apparatuses (e.g., memory devices 100, 200, 800, 900, 1000, 1100, and 1200) or part of each of these memory devices described above, may all be characterized as "modules" (or "module") herein. Such modules may include hardware circuitry, single- and/or multi-processor circuits, memory circuits, software program modules and objects and/or firmware, and combinations thereof, as desired and/or as appropriate for particular implementations of various embodiments. For example, such modules may be included in a system operation simulation package, such as a software electrical signal simulation package, a power usage and ranges simulation package, a capacitance-inductance simulation package, a power/heat dissipation simulation package, a signal transmission-reception simulation package, and/or a combination of software and hardware used to operate or simulate the operation of various potential embodiments.

The memory devices (e.g., memory devices 100, 200, 800, 900, 1000, 1100, and 1200) described herein may be included in apparatuses (e.g., electronic circuitry) such as high-speed computers, communication and signal processing circuitry, single- or multi-processor modules, single or multiple embedded processors, multicore processors, message information switches, and application-specific modules including multilayer, multichip modules. Such apparatuses may further be included as subcomponents within a variety of other apparatuses (e.g., electronic systems), such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

The embodiments described above with reference to FIG. 1 through FIG. 12C include apparatuses and methods of operating the apparatuses. One of the apparatuses includes a first memory cell including a first transistor having a first channel region coupled between a data line and a conductive region, and a first charge storage structure located between the first data line and the conductive region, and a second transistor having a second channel region coupled to and located between the first data line and the first charge storage structure; a second memory cell including a third transistor having a third channel region coupled between a second data line and the conductive region, and a second charge storage structure located between the second line and the conductive region, and a fourth transistor having a fourth channel region coupled to and located between the second data line and the second charge storage structure; a conductive line forming a gate of each of the first, second, third, and fourth transistors; and a conductive structure located between the first and second charge storage structures and electrically separated from the conductive region. Other embodiments, including additional apparatuses and methods, are described.

In the detailed description and the claims, the term "on" used with respect to two or more elements (e.g., materials), one "on" the other, means at least some contact between the elements (e.g., between the materials). The term "over" means the elements (e.g., materials) are in close proximity, but possibly with one or more additional intervening elements (e.g., materials) such that contact is possible but not required. Neither "on" nor "over" implies any directionality as used herein unless stated as such.

In the detailed description and the claims, a list of items joined by the term "at least one of" can mean any combination of the listed items. For example, if items A and B are listed, then the phrase "at least one of A and B" means A only; B only; or A and B. In another example, if items A, B, and C are listed, then the phrase "at least one of A, B and C" means A only; B only; C only; A and B (excluding C); A and C (excluding B); B and C (excluding A); or all of A, B, and C. Item A can include a single element or multiple elements. Item B can include a single element or multiple elements. Item C can include a single element or multiple elements.

In the detailed description and the claims, a list of items joined by the term "one of" can mean only one of the list items. For example, if items A and B are listed, then the phrase "one of A and B" means A only (excluding B), or B only (excluding A). In another example, if items A, B, and C are listed, then the phrase "one of A, B and C" means A only; B only; or C only. Item A can include a single element or multiple elements. Item B can include a single element or multiple elements. Item C can include a single element or multiple elements.

The above description and the drawings illustrate some embodiments of the inventive subject matter to enable those skilled in the art to practice the embodiments of the inventive subject matter. Other embodiments may incorporate structural, logical, electrical, process, and other changes. Examples merely typify possible variations. Portions and features of some embodiments may be included in, or substituted for, those of others. Many other embodiments will be apparent to those of skill in the art upon reading and understanding the above description.

What is claimed is:

1. An apparatus comprising:
a first data line and a second data line;
a first conductive region, and a second conductive region separated from the first conductive region;
a first memory cell including a first transistor and a second transistor, the first transistor including a first channel region coupled between the first data line and the first conductive region, and a first charge storage structure, the second transistor including a second channel region coupled to the first data line and located over the first charge storage structure;
a second memory cell including a third transistor and a fourth transistor, the third transistor including a third channel region coupled between the second data line and the second conductive region, and a second charge storage structure, the fourth transistor including a fourth channel region coupled to the second data line and located over the second charge storage structure;
a conductive line forming a gate of each of the first, second, third, and fourth transistors; and
a conductive structure located between the first and second charge storage structures and electrically separated from the first and second conductive regions.

2. The apparatus of claim 1, further comprising:
a third memory cell including a first additional transistor and a second additional transistor, the first additional transistor including a first additional channel region coupled between the first data line and the first conductive region, and a third charge storage structure, the second additional transistor including a second additional channel region coupled to the first data line and located over the third charge storage structure;

a fourth memory cell including a third additional transistor and a fourth additional transistor, the third additional transistor including a third additional channel region coupled between the second data line and the second conductive region, and a fourth charge storage structure, the fourth additional transistor including a fourth additional channel region coupled to the second data line and located over the fourth charge storage structure; and wherein the conductive structure extends in a direction from a first memory cell to the first additional memory cell, and the conductive structure is located between the third and fourth charge storage structures.

3. The apparatus of claim 2, further comprising:

an additional conductive structure extending in a direction perpendicular to the conductive structure and electrically separated from the first and second conductive regions, the additional conductive structure is located between the first and third charge storage structures and between the second and fourth charge storage structures.

4. The apparatus of claim 1, wherein the first and second conductive regions and the first and second data lines have respective lengths extending in a same direction.

5. The apparatus of claim 1, wherein the conductive structure includes conductively doped polysilicon.

6. The apparatus of claim 1, wherein the conductive structure includes metal.

7. The apparatus of claim 1, wherein the conductive region includes a ground connection.

8. The apparatus of claim 1, wherein the first and third channel regions include a first material, and the second and fourth channel regions include a second material different from the first material.

9. The apparatus of claim 1, wherein each of the first and third channel regions includes a semiconductor material.

10. The apparatus of claim 1, wherein each of the second and fourth channel regions includes a semiconducting oxide material.

* * * * *